United States Patent
Lu et al.

(10) Patent No.: US 12,057,381 B2
(45) Date of Patent: Aug. 6, 2024

(54) CIRCUIT BOARD HAVING LAMINATED BUILD-UP LAYERS

(71) Applicant: Unimicron Technology Corp., Taoyuan (TW)

(72) Inventors: Chih-Chiang Lu, Taoyuan (TW);
Hsin-Ning Liu, Taichung (TW);
Jun-Rui Huang, Taoyuan (TW);
Pei-Wei Wang, Taipei (TW); Ching Sheng Chen, Hsinchu County (TW);
Shih-Lian Cheng, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 396 days.

(21) Appl. No.: 17/498,757

(22) Filed: Oct. 12, 2021

(65) Prior Publication Data

US 2022/0230949 A1     Jul. 21, 2022

Related U.S. Application Data

(60) Provisional application No. 63/235,105, filed on Aug. 19, 2021, provisional application No. 63/139,795, filed on Jan. 21, 2021.

(30) Foreign Application Priority Data

Sep. 14, 2021    (TW) ................................. 110134179

(51) Int. Cl.
*H01L 23/498*     (2006.01)
*H01L 21/48*      (2006.01)
(Continued)

(52) U.S. Cl.
CPC .... *H01L 23/49827* (2013.01); *H01L 21/4857* (2013.01); *H01L 21/486* (2013.01);
(Continued)

(58) Field of Classification Search
CPC ........... H01L 23/49827; H01L 21/4857; H01L 21/486; H01L 23/49822; H05K 1/0222; H05K 2201/0959; H05K 2201/09509
See application file for complete search history.

(56) References Cited

U.S. PATENT DOCUMENTS

2008/0218985 A1*    9/2008   Takeda ................. H05K 1/0222
                                                                        361/768
2011/0203842 A1     8/2011   Russell
(Continued)

FOREIGN PATENT DOCUMENTS

| TW | 201220967 | 5/2012 |
|---|---|---|
| TW | 201918134 | 5/2019 |
| TW | 201933562 | 8/2019 |

OTHER PUBLICATIONS

"Office Action of Taiwan Related Application, Application No. 111106293", issued on May 19, 2023, p. 1-p. 12.
(Continued)

*Primary Examiner* — Jay C Chang
*Assistant Examiner* — Mikka Liu
(74) *Attorney, Agent, or Firm* — JCIPRNET

(57) ABSTRACT

A circuit board includes a first external circuit layer, a first substrate, a second substrate, a third substrate, and a conductive through hole structure. The first substrate includes conductive pillars electrically connecting the first external circuit layer and the second substrate. The second substrate has an opening and includes a first dielectric layer. The opening penetrates the second substrate, and the first dielectric layer fills the opening. The third substrate includes an insulating layer, a second external circuit layer, and conductive holes. A conductive material layer of the conductive through hole structure covers an inner wall of a through hole and electrically connects the first and the second external circuit layers to define a signal path. The first external circuit
(Continued)

layer, the conductive pillars, the second substrate, the conductive holes and the second external circuit layer are electrically connected to define a ground path surrounding the signal path.

9 Claims, 21 Drawing Sheets

(51) Int. Cl.
    *H05K 1/02*     (2006.01)
    *H05K 3/00*     (2006.01)
    *H05K 3/42*     (2006.01)
    *H05K 3/46*     (2006.01)
    *H01L 23/00*     (2006.01)

(52) U.S. Cl.
    CPC ..... *H01L 23/49822* (2013.01); *H05K 1/0222* (2013.01); *H05K 3/0094* (2013.01); *H05K 3/429* (2013.01); *H05K 3/4614* (2013.01); *H05K 3/4623* (2013.01); *H01L 24/16* (2013.01); *H01L 2224/16227* (2013.01); *H05K 2201/09509* (2013.01); *H05K 2201/0959* (2013.01)

(56) References Cited

U.S. PATENT DOCUMENTS

| | | |
|---|---|---|
| 2013/0098669 A1 | 4/2013 | Yoshimura |
| 2015/0014045 A1 | 1/2015 | Brigham et al. |
| 2018/0184522 A1* | 6/2018 | Rodriguez ............ H05K 1/116 |

OTHER PUBLICATIONS

"Office Action of U.S. Appl. No. 17/711,027", issued on May 23, 2024, p. 1-p. 17.

* cited by examiner

CIRCUIT BOARD HAVING LAMINATED BUILD-UP LAYERS

CROSS-REFERENCE TO RELATED APPLICATION

This application claims the priority benefits of U.S. provisional applications Ser. No. 63/139,795, filed on Jan. 21, 2021 and Ser. No. 63/235,105, filed on Aug. 19, 2021. This application also claims the priority benefit of Taiwan application serial no. 110134179, filed on Sep. 14, 2021. The entirety of each of the above-mentioned patent applications is hereby incorporated by reference herein and made a part of this specification.

BACKGROUND

Technical Field

The disclosure relates to a substrate structure and a manufacturing method thereof, and more particularly, to a circuit board and a manufacturing method thereof, and an electronic device using the circuit board.

Description of Related Art

In the existing circuit board, the design of the coaxial via requires one or more insulating layers between the inner conductive layer and the external conductive layer for blocking, and the method of forming the insulating layer is achieved by laminating the build-up layer. Therefore, there will be an impedance mismatch at both ends of the coaxial via, and there will be an electromagnetic interference (EMI) shielding gap, which affects the integrity of high-frequency signals. In addition, in the design of the coaxial via, two ends of the signal path and two ends of the ground path are located on different planes, and the noise interference may not be reduced.

SUMMARY

The disclosure provides a circuit board, which has a good signal loop and may have better signal integrity.

The disclosure further provides a manufacturing method of a circuit board, which is configured to manufacture the above circuit board.

The disclosure further provides an electronic device, which includes the above circuit board and has better reliability of signal transmission.

The circuit board in the disclosure includes a first external circuit layer, a first substrate, a second substrate, a third substrate, and a conductive through hole structure. The first substrate is disposed between the first external circuit layer and the second substrate. The first substrate includes multiple conductive pillars, and the conductive pillars electrically connect the first external circuit layer and the second substrate. The second substrate has an opening and includes a first dielectric layer. The opening penetrates the second substrate, and the first dielectric layer fills the opening. The second substrate is disposed between the first substrate and the third substrate. The third substrate includes an insulating layer, a second external circuit layer located on the insulating layer, and multiple conductive holes penetrating the insulating layer and electrically connecting the second substrate and the second external circuit layer. The conductive through hole structure includes a through hole and a conductive material layer. The through hole penetrates the first substrate, the first dielectric layer of the second substrate, and the third substrate. The conductive material layer covers an inner wall of the through hole and electrically connects the first external circuit layer and the second external circuit layer to define a signal path. The first external circuit layer, the conductive pillars, the second substrate, the conductive holes, and the second external circuit layer are electrically connected to define a ground path. The ground path surrounds the signal path.

In an embodiment of the disclosure, the first substrate further includes a base, and the conductive pillars penetrate the base. The second substrate further includes a core layer, a first circuit layer, a second circuit layer, and a conductive connection layer. The first circuit layer and the second circuit layer are respectively disposed on two opposite sides of the core layer. The core layer has the opening, and the conductive connection layer is disposed on an inner wall of the opening and located between the first dielectric layer and the core layer. The conductive connection layer electrically connects the first circuit layer and the second circuit layer. The conductive pillars electrically connect the first external circuit layer and the first circuit layer.

In an embodiment of the disclosure, the first substrate further includes a dielectric material bulk penetrating the base and located between the conductive pillars. A peripheral surface of the dielectric material bulk directly contacts the conductive pillars.

In an embodiment of the disclosure, the first external circuit layer includes a first signal trace and a first ground trace. The second external circuit layer includes a second signal trace and a second ground trace. The first signal trace, the conductive material layer, and the second signal trace define the signal path. The first ground signal path, the conductive pillars, the first circuit layer, the conductive connection layer, the second circuit layer, the conductive holes, and the second ground trace define the ground path.

In an embodiment of the disclosure, the conductive through hole structure further includes a second dielectric layer filling the through hole. A first surface and a second surface of the second dielectric layer opposite to each other are respectively flush with an upper surface of the first external circuit layer and a lower surface of the second external circuit layer.

In an embodiment of the disclosure, the conductive through hole structure further includes a second dielectric layer filling the through hole. The first external circuit layer and the second external circuit layer respectively cover a first surface and a second surface of the second dielectric layer opposite to each other.

The manufacturing method of the circuit board in the disclosure includes the following steps. A metal layer, a first substrate, a second substrate, and a third substrate are laminated, so that the first substrate is located between the metal layer and the second substrate, and the second substrate is located between the first substrate and the third substrate. The first substrate includes multiple conductive pillars. The second substrate has an opening and includes a first dielectric layer. The opening penetrates the second substrate, and the first dielectric layer fills the opening. The third substrate includes an insulating layer and a conductive layer located on the insulating layer. Multiple blind holes and a through hole are formed. The blind holes extend from the third substrate to the second substrate. The through hole penetrates the metal layer, the first substrate, the first dielectric layer of the second substrate, and the insulating layer and the conductive layer of the third substrate. A conductive material layer is formed, which covers the metal layer, the conductive layer of the third substrate, and an inner wall of the through hole, and fills the blind holes to define multiple conductive holes. The conductive material layer, the metal layer, and the conductive layer are patterned to form a first external circuit layer located on the first substrate and electrically connected to the conductive pillars, and a second external circuit layer located on the insulating layer and electrically connected to the conductive holes, and define a conductive through hole structure connecting the first external circuit layer and the second external circuit layer and located in the through hole. The conductive through hole structure electrically connects the first external circuit layer and the second external circuit layer to define a signal path. The first external circuit layer, the conductive pillars, the second substrate, the conductive holes, and the second external circuit layer are electrically connected to define a ground path. The ground path surrounds the signal path.

In an embodiment of the disclosure, laminating the metal layer, the first substrate, the second substrate, and the third substrate includes the following steps. The metal layer is provided. The first substrate is provided. The first substrate further includes a base, and the conductive pillars penetrates the base. The second substrate is provided. The second substrate further includes a core layer, a first circuit layer, a second circuit layer, and a conductive connection layer. The first circuit layer and the second circuit layer are respectively disposed on two opposite sides of the core layer. The core layer has the opening, and the conductive connection layer is disposed on an inner wall of the opening and located between the first dielectric layer and the core layer. The conductive connection layer electrically connects the first circuit layer and the second circuit layer. The third substrate is provided. The first substrate and the second substrate are located between the metal layer and the third substrate. The first substrate are located between the metal layer and the second substrate, and the second substrate are located between the first substrate and the third substrate. A thermal lamination process is performed to laminate the metal layer, the first substrate, the second substrate, and the third substrate, so that the metal layer directly covers the base of the first substrate and one side of the conductive pillars. The conductive pillars connect the metal layer and the first circuit layer of the second substrate, and the insulating layer of the third substrate connects the second circuit layer of the second substrate.

In an embodiment of the disclosure, the manufacturing method of the circuit board further includes that after the conductive material layer is formed, and before the conductive material layer, the metal layer, and the conductive layer are patterned, a second dielectric layer is stuffed in the through hole. The second dielectric layer fills the through hole, and a first surface and a second surface of the second dielectric layer opposite to each other are respectively flush with an upper surface and a lower surface of the conductive material layer.

In an embodiment of the disclosure, the manufacturing method of the circuit board further includes that after the second dielectric layer is stuffed in the through hole, and before the conductive material layer, the metal layer, and the conductive layer are patterned, a capping layer is formed on the conductive material layer. The capping layer covers the conductive material layer and the first surface and the second surface of the second dielectric layer. The capping layer, the conductive material layer, the metal layer, and the conductive layer are patterned to form the first external circuit layer and the second external circuit layer. The first external circuit layer is located on the base of the first substrate and on the first surface of the second dielectric layer. The second external circuit layer is located on the insulating layer of the third substrate and on the second surface of the second dielectric layer.

In an embodiment of the disclosure, the first external circuit layer includes a first signal trace and a first ground trace. The second external circuit layer includes a second signal trace and a second ground trace. The first signal trace, the conductive material layer, and the second signal trace define the signal path. The first ground signal path, the conductive pillars, the first circuit layer, the conductive connection layer, the second circuit layer, the conductive holes, and the second ground trace define the ground path.

In an embodiment of the disclosure, laminating the metal layer, the first substrate, the second substrate, and the third substrate includes the following steps. The metal layer is provided. The first substrate is provided. The first substrate further includes the base and a dielectric material bulk penetrating the base. The dielectric material bulk is located between the conductive pillars, and a peripheral surface of the dielectric material bulk directly contacts the conductive pillars. The second substrate is provided. The second substrate further includes a core layer, a first circuit layer, a second circuit layer, and a conductive connection layer. The first circuit layer and the second circuit layer are respectively disposed on two opposite sides of the core layer. The core layer has the opening, and the conductive connection layer is disposed on an inner wall of the opening and located between the first dielectric layer and the core layer. The conductive connection layer electrically connects the first circuit layer and the second circuit layer. The third substrate is provided. The first substrate and the second substrate are located between the metal layer and the third substrate. The first substrate are located between the metal layer and the second substrate. The second substrate are located between the first substrate and the third substrate. A thermal lamination process is performed to laminate the metal layer, the first substrate, the second substrate, and the third substrate, so that the metal layer directly covers the base of the first substrate, one side of the conductive pillars, and a surface of the dielectric material bulk. The conductive pillars connect the metal layer and the first circuit layer of the second substrate. An another surface of the dielectric material bulk directly contacts the first dielectric layer and the first circuit layer of the second substrate. The insulating layer of the third substrate connects the second circuit layer of the second substrate.

In an embodiment of the disclosure, when the through hole is formed, the through hole penetrates the dielectric material bulk at the same time.

In an embodiment of the disclosure, the manufacturing method of the circuit board further includes that after the conductive material layer is formed, and before the conductive material layer, the metal layer, and the conductive layer are patterned, a second dielectric layer is stuffed in the through hole. The second dielectric layer fills the through hole, and a first surface and a second surface of the second dielectric layer opposite to each other are respectively flush with an upper surface and a lower surface of the conductive material layer.

In an embodiment of the disclosure, the manufacturing method of the circuit board further includes that after the second dielectric layer is stuffed in the through hole, and before the conductive material layer, the metal layer, and the conductive layer are patterned, a capping layer is formed on the conductive material layer. The capping layer covers the conductive material layer and the first surface and the second surface of the second dielectric layer. The capping layer, the conductive material layer, the metal layer, and the conductive layer are patterned to form the first external circuit layer and the second external circuit layer. The first external circuit layer is located on the base of the first substrate and on the first surface of the second dielectric layer. The second external circuit layer is located on the insulating layer of the third substrate and on the second surface of the second dielectric layer.

In an embodiment of the disclosure, the first external circuit layer includes a first signal trace and a first ground trace. The second external circuit layer includes a second signal trace and a second ground trace. The first signal trace, the conductive material layer, and the second signal trace define the signal path. The first ground signal path, the conductive pillars, the first circuit layer, the conductive connection layer, the second circuit layer, the conductive holes, and the second ground trace define the ground path.

In an embodiment of the disclosure, a dissipation factor (Df) of the dielectric material bulk is greater than 0 and less than 0.016.

The electronic device in the present invention includes a circuit board and an electronic element. The circuit board includes a first external circuit layer, a first substrate, a second substrate, a third substrate, and a conductive through hole structure. The first substrate is disposed between the first external circuit layer and the second substrate. The first substrate includes multiple conductive pillars, and the conductive pillars electrically connect the first external circuit layer and the second substrate. The second substrate has an opening and includes a first dielectric layer. The opening penetrates the second substrate, and the first dielectric layer fills the opening. The second substrate is disposed between the first substrate and the third substrate. The third substrate includes an insulating layer, a second external circuit layer located on the insulating layer, and multiple conductive holes penetrating the insulating layer and electrically connecting the second substrate and the second external circuit layer. The conductive through hole structure includes a through hole and a conductive material layer. The through hole penetrates the first substrate, the first dielectric layer of the second substrate, and the third substrate. The conductive material layer covers an inner wall of the through hole and electrically connects the first external circuit layer and the second external circuit layer to define a signal path. The first external circuit layer, the conductive pillars, the second substrate, the conductive holes, and the second external circuit layer are electrically connected to define a ground path. The ground path surrounds the signal path. The electronic element is electrically connected to the circuit board.

In an embodiment of the disclosure, the electronic device further includes multiple connecting members disposed between the third substrate of the circuit board and the electronic element. The electronic element is electrically connected to the circuit board through the connecting members.

In an embodiment of the disclosure, the connecting members include multiple solder balls.

Based on the above, in the design of the circuit board in the disclosure, the conductive material layer of the conductive through hole structure electrically connects the first external circuit layer and the second external circuit layer to define the signal path, and the first external circuit layer, the conductive pillars, the second substrate, the conductive holes, and the second external circuit layer are electrically connected to define the ground path. The ground path surrounds the signal path. In this way, the good high-frequency and high-speed signal loop may be formed, and in the subsequent applications of the integrated circuit and the antenna, the issue of signal interference on the same plane may also be solved, which may reduce the signal energy loss and reduce the noise interference. As a result, the reliability of signal transmission may be improved.

In order for the aforementioned features and advantages of the disclosure to be more comprehensible, embodiments accompanied with drawings are described in detail below.

DETAILED DESCRIPTION OF DISCLOSED EMBODIMENTS

Figure 1A:
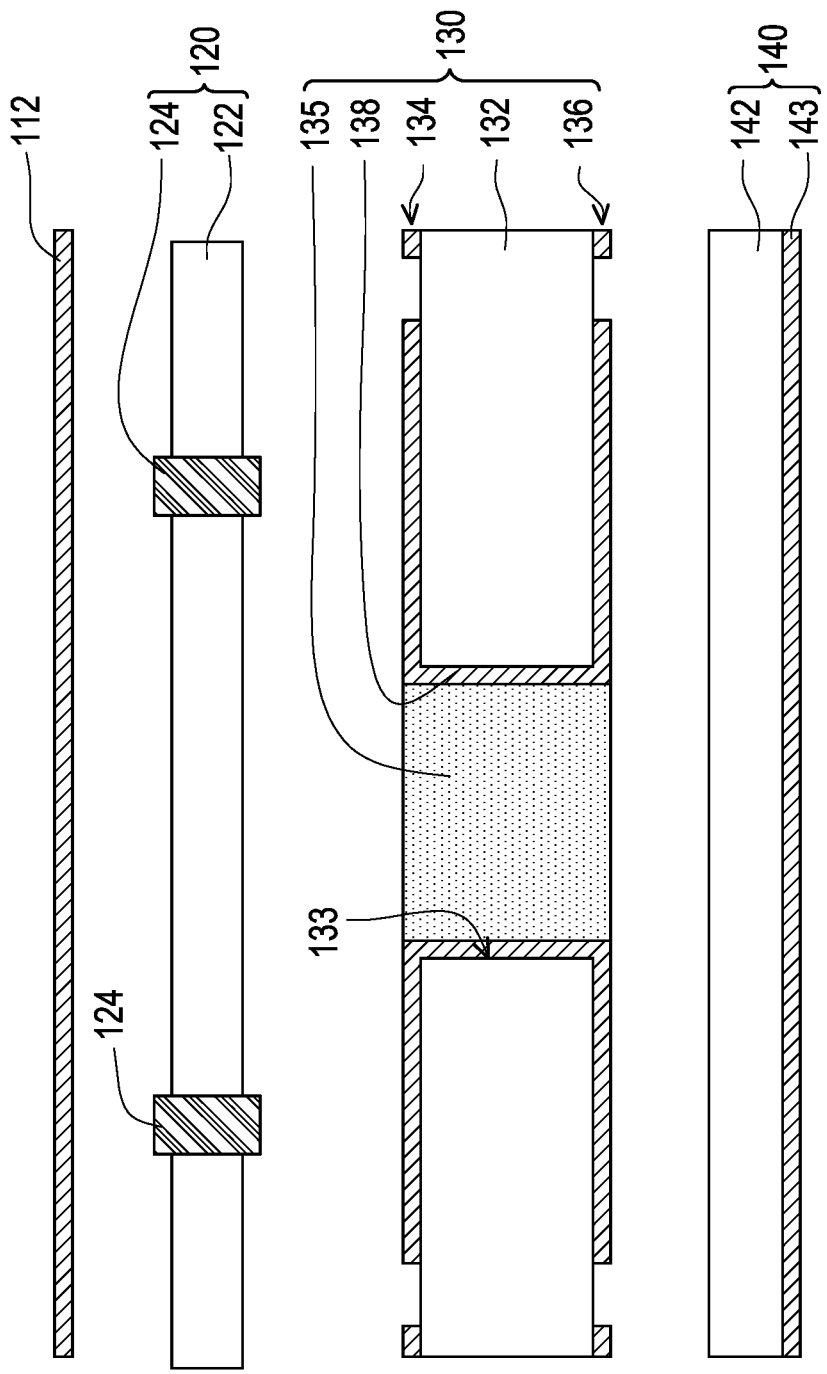
FIGS. 1A to 1E are schematic cross-sectional views of a manufacturing method of a circuit board according to an embodiment of the disclosure.

FIGS. 1A to 1E are schematic cross-sectional views of a manufacturing method of a circuit board according to an embodiment of the disclosure. FIG. 1F is a schematic top view of the circuit board of FIG. 1E. Regarding the manufacturing method of the circuit board in this embodiment, first, referring to FIG. 1A, a metal layer 112, a first substrate 120, a second substrate 130, and a third substrate 140 are provided.

In detail, the first substrate 120 includes a base 122 and multiple conductive pillars 124 penetrating the base 122. Providing the first substrate 120 includes the following steps. First, the base 122 is provided, and the base 122 is in a B-stage state at this time, which means that the base 122 has not been completely cured. Then, a release film may be attached to two opposite sides of the base 122, and a material of the release film is, for example, polyester polymer (PET). Afterwards, a drilling process is performed on the base 122 to form a through hole. The drilling process is, for example, laser drilling or mechanical drilling, but the disclosure is not limited thereto. Finally, a conductive adhesive is stuffed in the through hole by printing or injection to form the conductive pillars 124. Afterwards, the release film attached to the two opposite sides of the base 122 are removed, so that two opposite surfaces of the conductive pillars 124 respectively protrude from two opposite surfaces of the base 122, to complete the manufacture of the first base 120.

Referring to FIG. 1A again, the second substrate 130 includes a core layer 132, a first circuit layer 134, a first dielectric layer 135, a second circuit layer 136, and a conductive connection layer 138. The core layer 132 has an opening 133. The opening 133 penetrates the second substrate 130, and the first dielectric layer 135 fills the opening 133. Here, two opposite sides of the first dielectric layer 135 are substantially flush with two opposite ends of the opening 133. The first circuit layer 134 and the second circuit layer 136 are respectively disposed on two opposite sides of the core layer 132. The conductive connection layer 138 covers an inner wall of the opening 133, and is located between the first dielectric layer 135 and the core layer 132. The conductive connection layer 138 electrically connects the first circuit layer 134 and the second circuit layer 136. The third substrate 140 includes an insulating layer 142 and a conductive layer 143 located on the insulating layer 142.

Referring to FIG. 1A again, the first substrate 120 and the second substrate 130 are located between the metal layer 112 and the third substrate 140. The first substrate 120 is located between the metal layer 112 and the second substrate 130, and the second substrate 130 is located between the first substrate 120 and the third substrate 140.

Figure 1B:
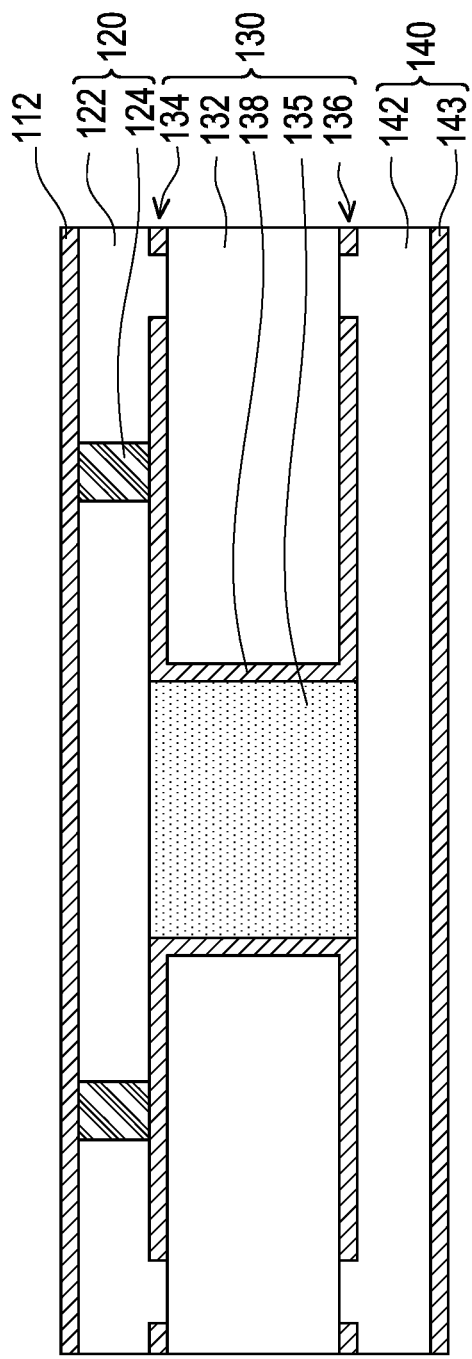

Referring to FIG. 1B, a thermal lamination process is performed to laminate the metal layer 112, the first substrate 120, the second substrate 130, and the third substrate 140, so that the metal layer 112 directly covers the base 122 of the first substrate 120 and one side of the conductive pillars 124. Here, since the thermal lamination process is adopted, at this time, the base 122 of the first substrate 120 changes from the original B-stage state to a C-stage state, which means that the base 122 of the first substrate 120 is in a completely cured state, so that the metal layer 112 and the second substrate 130 are respectively connected to the first substrate 120. The conductive pillars 124 of the first substrate 120 are deformed by leaning against the metal layer 112 and the first circuit layer 134, and the conductive pillars 124 electrically connect the metal layer 112 and the first circuit layer 134 of the second substrate 130. The base 122 of the first substrate 120 covers the core layer 132, the first circuit layer 134, and the first dielectric layer 135 of the second substrate 130. The insulating layer 142 of the third substrate 140 is connected to the second circuit layer 136 and covers the core layer 132, the first dielectric layer 135, and the second circuit layer 136 of the second substrate 130.

Figure 1C:
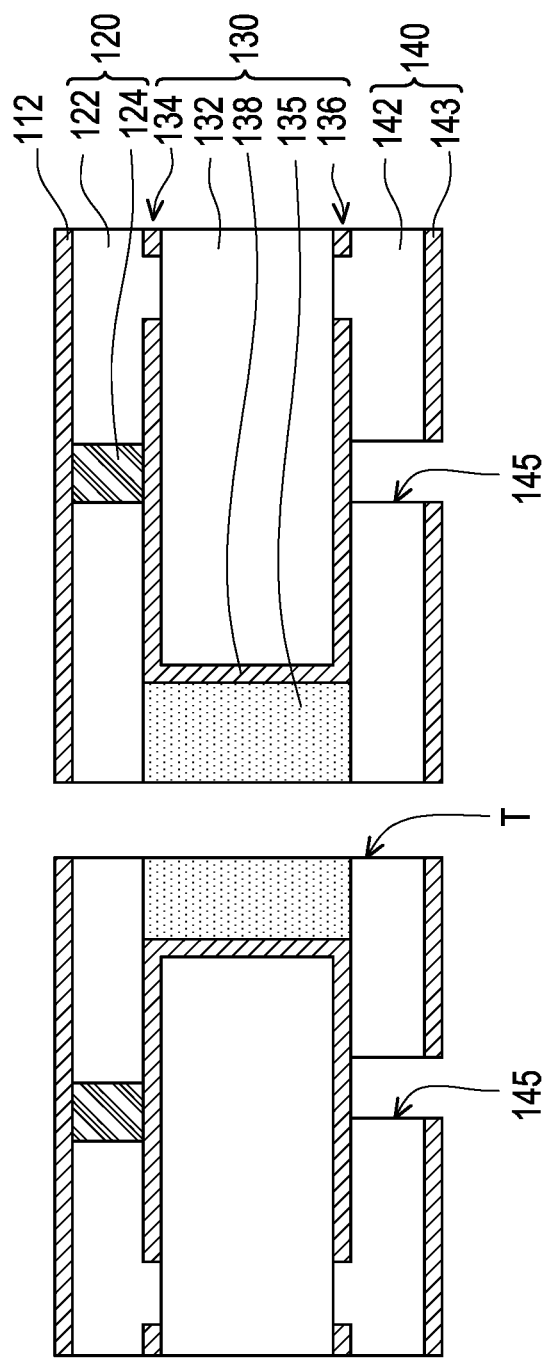

Referring to FIG. 1C, multiple blind holes 145 and a through hole T are formed. The blind holes 145 extend from the third substrate 140 to the second substrate 130, and expose the second circuit layer 136. The through hole T penetrates the metal layer 112, the first substrate 120, the first dielectric layer 135 of the second substrate 130, and the insulating layer 142 and the conductive layer 143 of the third substrate 140. Here, a method of forming the blind holes 145 is, for example, laser drilling, and a method of forming the through hole T is, for example, mechanical drilling. However, the disclosure is not limited thereto.

Figure 1D:
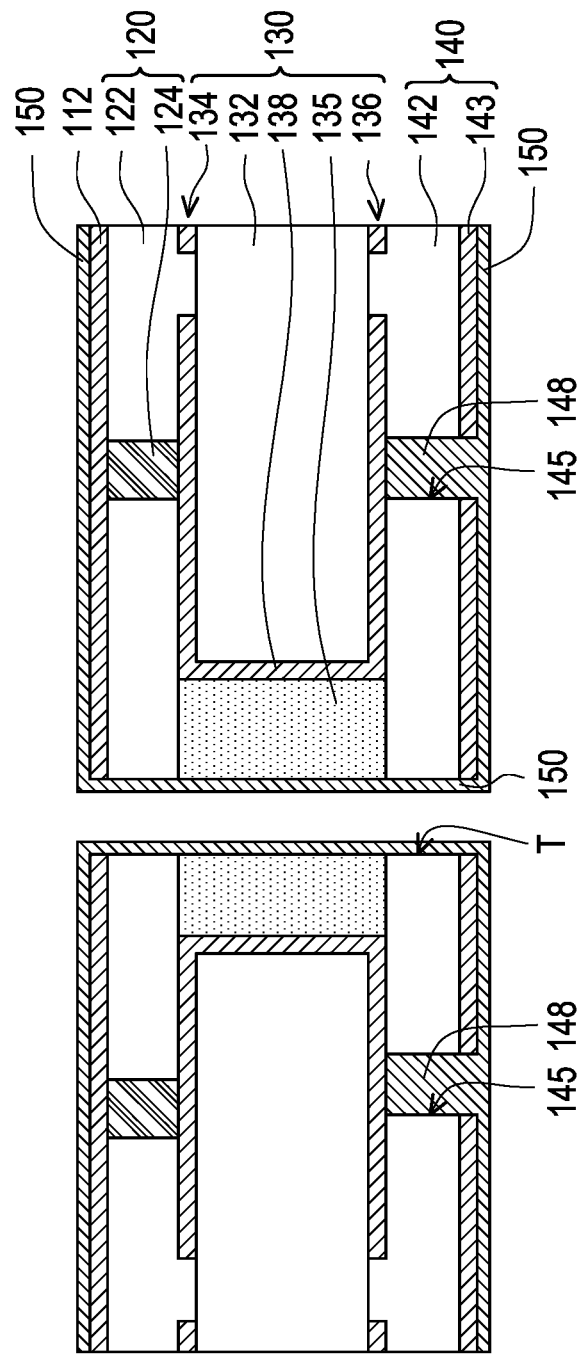

Referring to FIG. 1D, a conductive material layer 150 is formed, which covers the metal layer 112, the conductive layer 143 of the third substrate 140, and an inner wall of the through hole T, and fills the blind holes 145 to define multiple conductive holes 148. Here, a method of forming the conductive material layer 150 is, for example, plating, and the conductive material layer 150 is, for example, copper. However, the disclosure is not limited thereto.

Figure 1E:
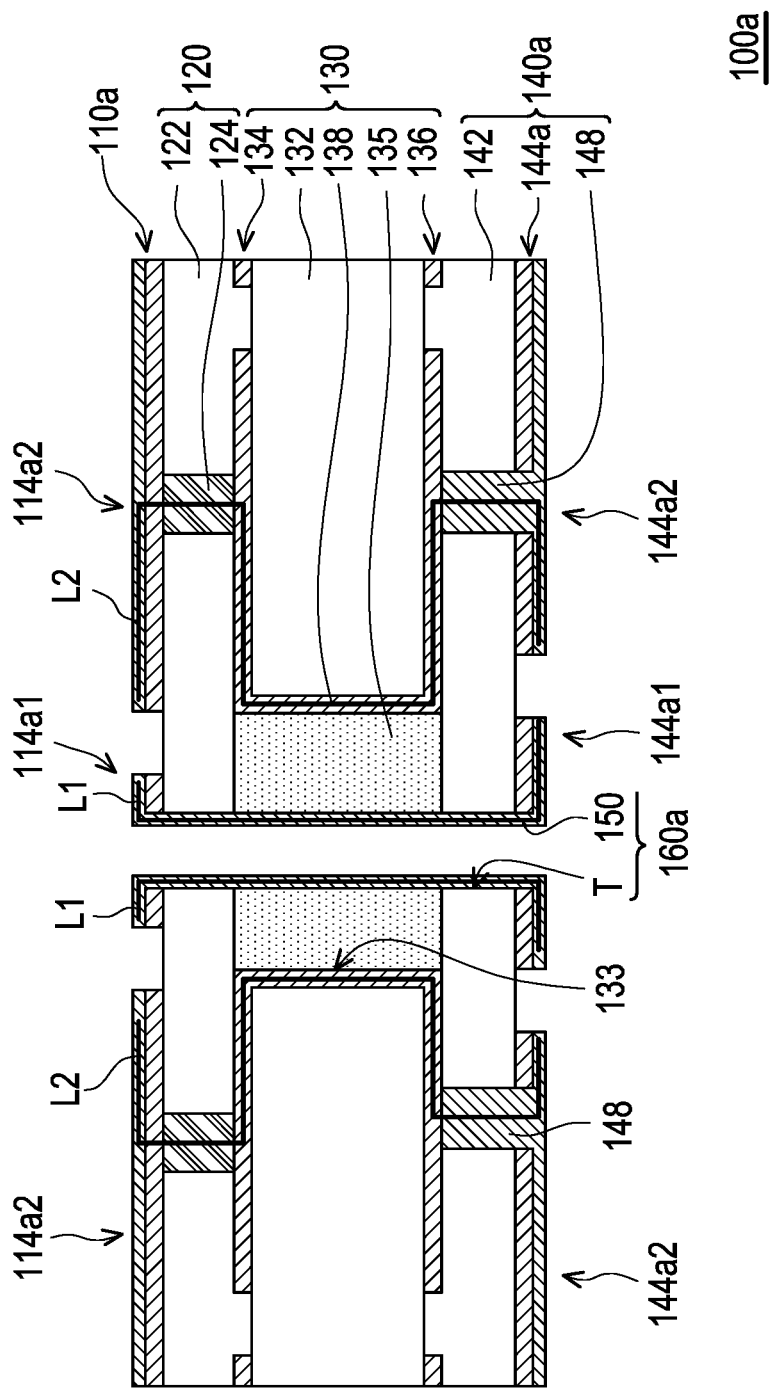
Figure 1F:
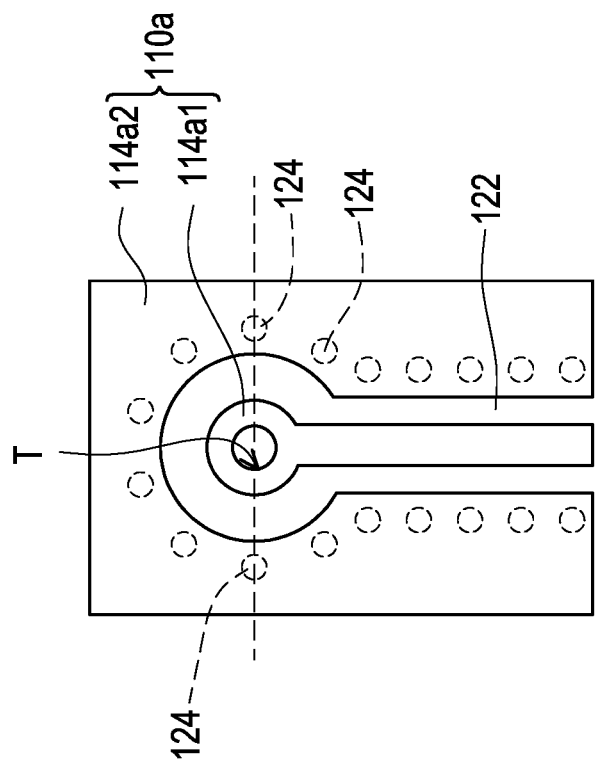
FIG. 1F is a schematic top view of the circuit board of FIG. 1E.

Finally, referring to both FIGS. 1D and 1E, the conductive material layer 150, the metal layer 112, and the conductive layer 143 are patterned through a lithography process to form a first external circuit layer 110a located on the first substrate 120 and electrically connected to the conductive pillars 124 and a second external circuit layer 144a located on the insulating layer 142 and electrically connected to the conductive holes 148, and define a conductive through hole structure 160a connecting the first external circuit layer 110a and the second external circuit layer 144a and located in the through hole T. The conductive through hole structure 160a electrically connects the first external circuit layer 110a and the second external circuit layer 144a to define a signal path L1. The first external circuit layer 110a, the conductive pillars 124, the second substrate 130, the conductive holes 148, and the second external circuit layer 144a are electrically connected to define a ground path L2. In particular, the ground path L2 surrounds the signal path L1, and two sides of the signal path L1 and two sides of the ground path L2 are respectively located on the same plane. So far, the manufacture of a circuit board 100a has been completed.

In terms of the structure, referring to both FIGS. 1E and 1F, in this embodiment, the circuit board 100a includes the first external circuit layer 110a, the first substrate 120, the second substrate 130, the third substrate 140, and the conductive through hole structure 160a. The first substrate 120 is disposed between the first external circuit layer 110a and the second substrate 130. The first substrate 120 includes the conductive pillars 124, and the conductive pillars 124 electrically connects the first external circuit layer 110a and the second substrate 130. The second substrate 130 has the opening 133 and includes the first dielectric layer 135. The opening 133 penetrates the second substrate 130, and the first dielectric layer 135 fills the opening 133. The second substrate 130 is disposed between the first substrate 120 and the third substrate 140. The third substrate 140 includes the insulating layer 142, the second external circuit layer 144a located on the insulating layer 142, and the conductive holes 148 penetrating the insulating layer 142 and electrically connecting the second substrate 130 and the second external circuit layer 144a. The conductive through hole structure 160a includes the through hole T and the conductive material layer 150. The through hole T penetrates the first substrate 120, the first dielectric layer 135 of the second substrate 130, and the third substrate 140. The conductive material layer 150 covers the inner wall of the through hole T and electrically connects the first external circuit layer 110a and the second external circuit layer 144a to define the signal path L1. The first external circuit layer 110a, the conductive pillars 124, the second substrate 130, the conductive holes 148, and the second external circuit layer 144a are electrically connected to define the ground path L2. The ground path L2 surrounds the signal path L1.

In detail, the first substrate 120 further includes the base 122, and the conductive pillars 124 penetrate the base 122. The second substrate 130 further includes the core layer 132, the first circuit layer 134, the second circuit layer 136, and the conductive connection layer 138. The first circuit layer 134 and the second circuit layer 136 are respectively disposed on the two opposite sides of the core layer 132. The core layer 132 has the opening 133, and the conductive connection layer 138 is disposed on the inner wall of the opening 133 and located between the first dielectric layer 135 and the core layer 132. The conductive connection layer 138 electrically connects the first circuit layer 134 and the second circuit layer 136. The conductive pillars 124 electrically connect the first external circuit layer 110a and the first circuit layer 134.

In addition, the first external circuit layer 110a in this embodiment includes a first signal trace 114a1 and a first ground trace 114a2. The second external circuit layer 144a includes a second signal trace 144a1 and a second ground trace 144a2. The first signal trace 114a1, the conductive material layer 150, and the second signal trace 144a1 define the signal path L1. The first ground trace 114a2, the conductive pillars 124, the first circuit layer 134, the conductive connection layer 138, the second circuit layer 136, the conductive holes 148, and the second ground trace 144a2 define the ground path L2. Since the signal path L1 is surrounded by the ground path L2 and is enclosed in a closed manner, the signal path L1 may form a good high-frequency and high-speed loop. In addition, the two sides of the signal path L1 and the two sides of the ground path L2 are respectively located on the same plane. Since the circuit board 100a in this embodiment is provided with the conductive pillars 124 and the conductive holes 148, a shielding gap may be filled to form a complete shield, which may effectively reduce the signal energy loss and reduce the noise interference. As a result, the reliability of signal transmission may be improved.

In brief, in this embodiment, the signal path L1 defined by the first signal trace 114a1, the conductive material layer 150, and the second signal trace 144a1 is surrounded by the ground path L2 defined by the first ground trace 114a2, the conductive pillars 124, the first circuit layer 134, the conductive connection layer 138, the second circuit layer 136, the conductive holes 148, and the second ground trace 144a2. This is, the ground path L2 with a good closure property is disposed around the signal path L1 that may transmit a high-frequency and high-speed signal such as 5G. In this way, the good high-frequency and high-speed loop may be formed, so that the circuit board 100a in this embodiment may have better signal integrity. Here, the high frequency refers to a frequency greater than 1 GHz; and the high speed refers to a data transmission speed greater than 100 Mbps.

Furthermore, the first substrate 120 and the second substrate 130 provided in this embodiment are finished products of the circuit boards, while the metal layer 112 and the third substrate 140 are semi-finished products, and the metal layer 112, the first substrate 120, the second substrate 130, and the third substrate 140 are integrated by laminating. The conductive through hole structure 160a, the conductive connection layer 138 of the second substrate 130, and the first dielectric layer 135 define a coaxial via. The first dielectric layer 135 is located between the conductive through hole structure 160a and the conductive connection layer 138. Compared with the conventional technology using a build-up method of laminating the insulating layer to block an inner conductive layer and an external conductive layer of the coaxial via, a manufacturing method of the circuit board 100a in this embodiment may avoid an impedance mismatch that affects the integrity of the high-frequency signal.

In addition, since in this embodiment, the build-up method of laminating the insulating layer is not used to increase the number of layers of the circuit board, a design of stacking holes of the conductive holes is not used to conduct adjacent structural layers. Therefore, the manufacturing method of the circuit board 100a in this embodiment may not only overcome an energy loss of the conductive holes, but also avoid an issue of poor reliability of thermal stress of the stacking holes.

It is noted that some of the reference numerals and descriptions of the above embodiment will apply to the following embodiments. The same reference numerals will represent the same or similar components and the descriptions of the same technical contents will be omitted. Reference may be made to the above embodiment for the omitted descriptions, which will not be repeated in the following embodiments.

Figure 2A:
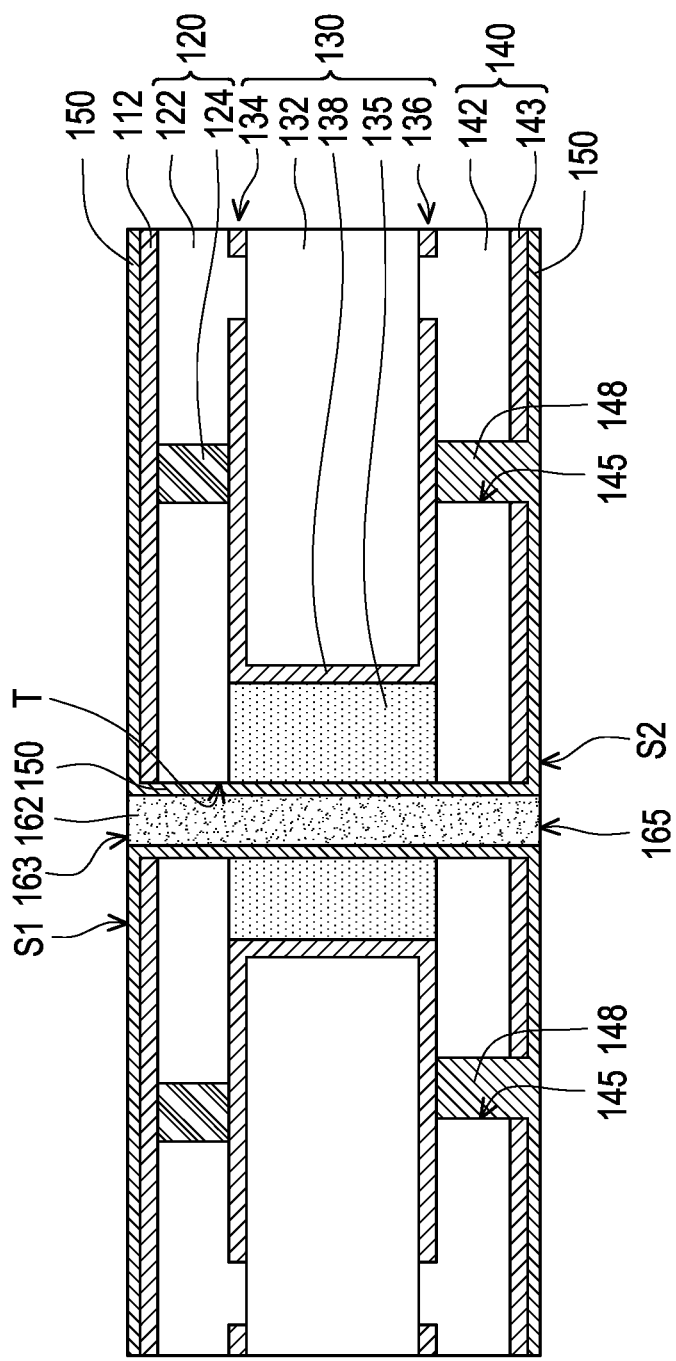
FIGS. 2A to 2B are schematic cross-sectional views of partial steps of a manufacturing method of another circuit board according to another embodiment of the disclosure.
Figure 2B:
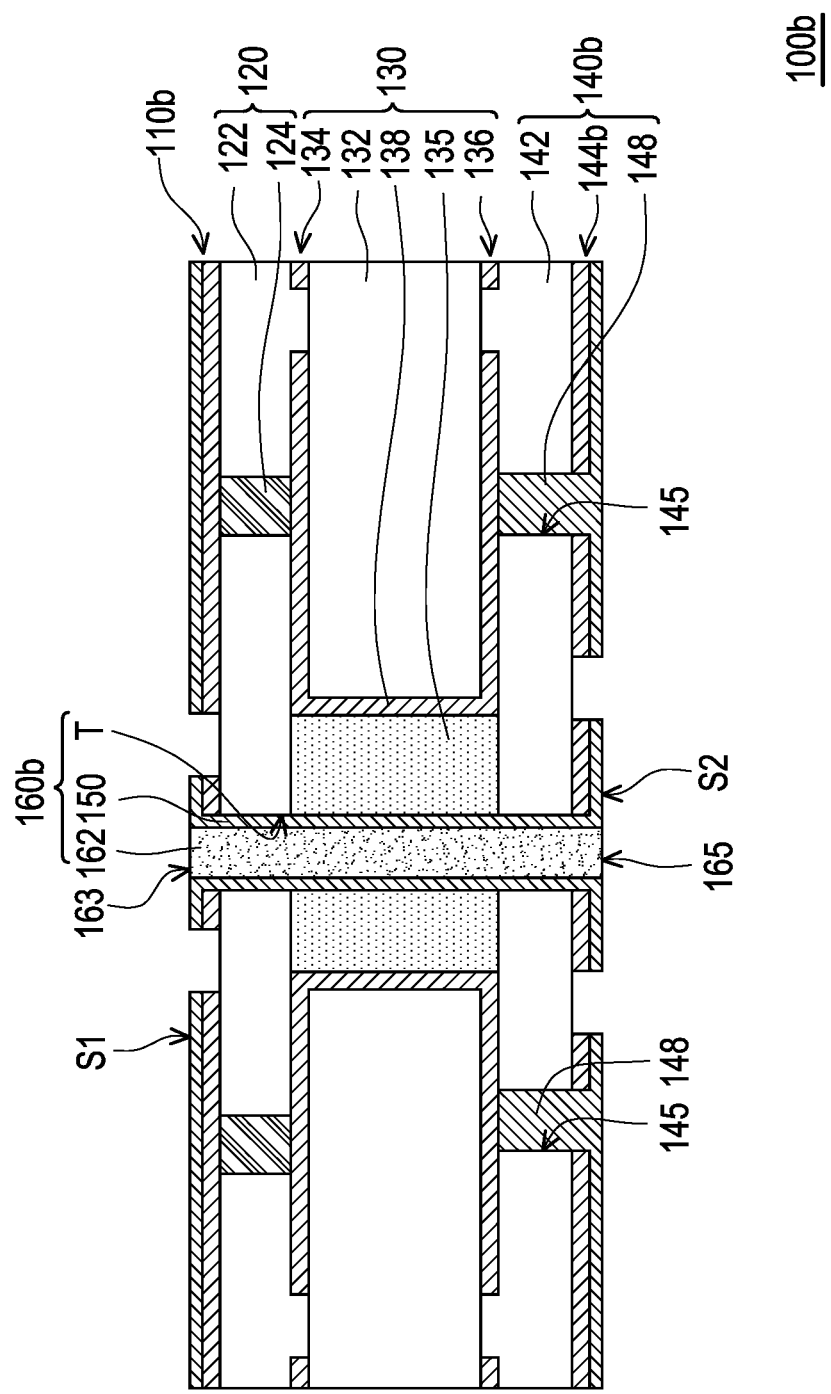

FIGS. 2A to 2B are schematic cross-sectional views of partial steps of a manufacturing method of another circuit board according to another embodiment of the disclosure. Referring to both FIGS. 1D and 2A, the manufacturing method of the circuit board in this embodiment is similar to that of the above circuit board. A difference between the two is that after forming the conductive material layer 150 in FIG. 1D, referring to FIG. 2A, a plugging process is performed to stuff a second dielectric layer 162 in the through hole T, and the second dielectric layer 162 fills the through hole T. Preferably, a first surface 163 and a second surface 165 of the second dielectric layer 162 opposite to each other are respectively flush with an upper surface Si and a lower surface S2 of the conductive material layer 150. If the second dielectric layer 162 is higher than the upper surface S1 and the lower surface S2 of the conductive material layer 150, the first surface 163 and the second surface 165 of the second dielectric layer 162 may be respectively flush with the conductive material by selectively grinding, thereby maintaining better flatness. Here, a material of the second dielectric layer 162 is, for example, resin, which may be regarded as a plugging agent.

Referring to both FIGS. 2A and 2B, the lithography process is performed to pattern the conductive material layer 150, the metal layer 112, and the conductive layer 143, so as to form a first external circuit layer 110b and a second external circuit layer 144b. The first external circuit layer 110b is located on the base 122 of the first substrate 120, and the second external circuit layer 144a is located on the insulating layer 142 of a third substrate 140b. Here, a conductive through hole structure 160b includes the through hole T, the conductive material layer 150, and the second dielectric layer 162 located in the through hole T. So far, the manufacture of a circuit board 100b has been completed.

Figure 3A:
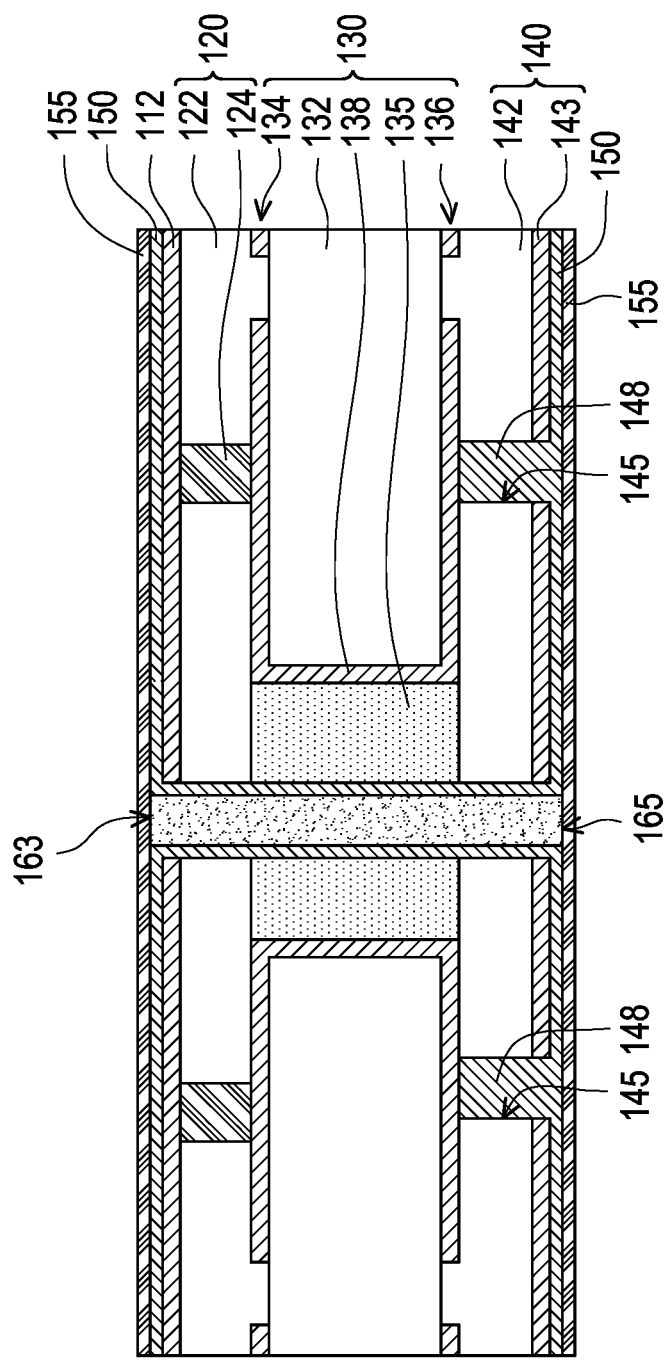
FIGS. 3A to 3B are schematic cross-sectional views of partial steps of a manufacturing method of another circuit board according to another embodiment of the disclosure.
Figure 3B:
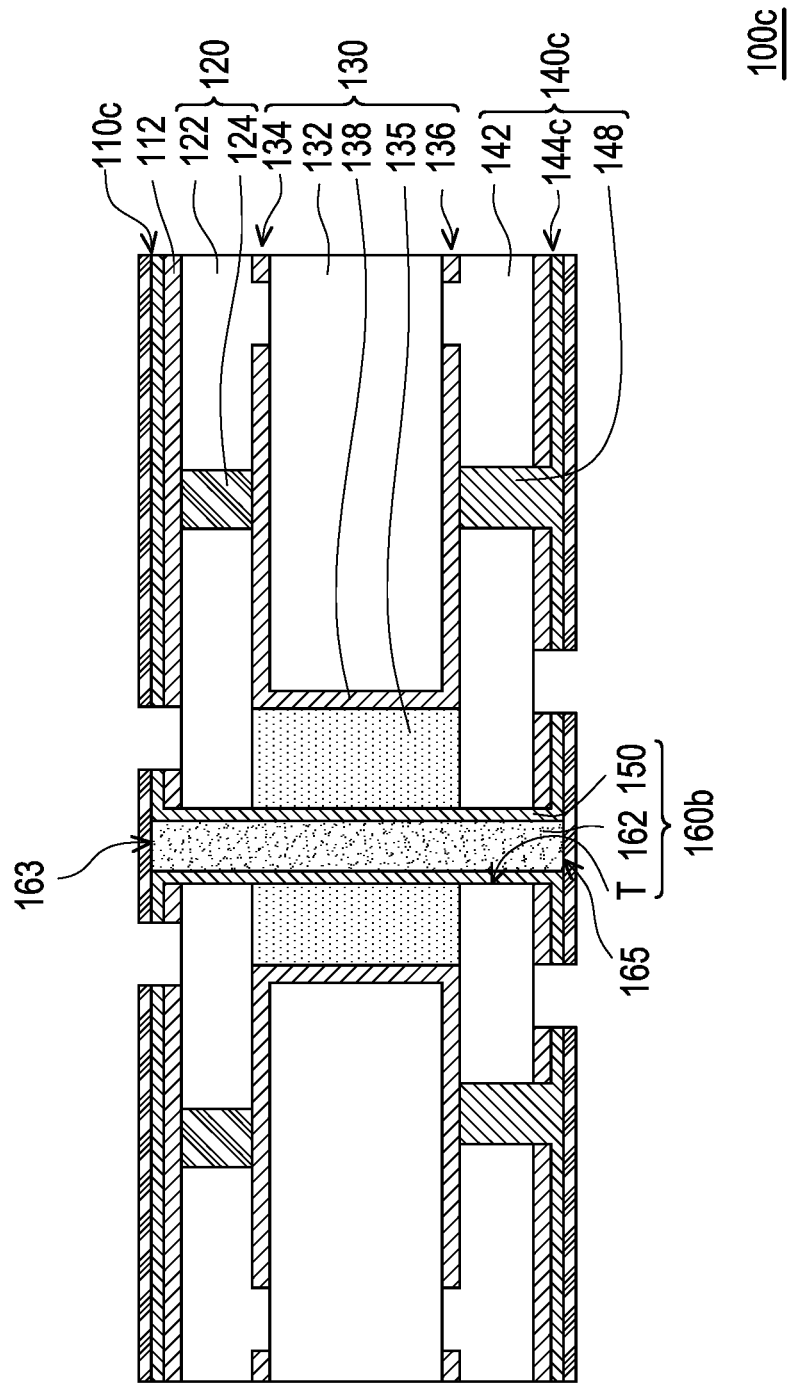

FIGS. 3A to 3B are schematic cross-sectional views of partial steps of a manufacturing method of another circuit board according to another embodiment of the disclosure. Referring to both FIGS. 2A and 3A, the manufacturing method of the circuit board in this embodiment is similar to that of the above circuit board. A difference between the two is that after stuffing the second dielectric layer 162 in the through hole T in FIG. 2A, referring to FIG. 3A, a capping layer 155 is formed on the conductive material layer 150. The capping layer 155 covers the conductive material layer 150, and the first surface 163 and the second surface 165 of the second dielectric layer 162. Here, a material of the capping layer 155 is, for example, copper, but the disclosure is not limited thereto.

Referring to both FIGS. 3A and 3B, the lithography process is performed to pattern the capping layer 155, the conductive material layer 150, the metal layer 112, and the conductive layer 143, so as to form a first external circuit layer 110c and a second external circuit layer 144c. The first external circuit layer 110c is located on the base 122 of the first substrate 120 and on the first surface 163 of the second dielectric layer 162. The second external circuit layer 144c is located on the insulating layer 142 of a third substrate 140c and on the second surface 165 of the second dielectric layer 162. So far, the manufacture of a circuit board 100c has been completed.

FIGS. 4A to 4E are schematic cross-sectional views of a manufacturing method of another circuit board according to another embodiment of the disclosure. Referring to both FIGS. 1A and 4A, the manufacturing method of the circuit board in this embodiment is similar to that of the above circuit board. A difference between the two is that a first substrate 120d in this embodiment is different from the first substrate 120.

In detail, the first substrate 120d in this embodiment further includes a dielectric material bulk 126 penetrating the base 122. The dielectric material bulk 126 is located between the conductive pillars 124, and a peripheral surface of the dielectric material bulk 126 directly contacts the conductive pillars 124. During the manufacture, first, the base 122 is provided. The base 122 is in the B-stage state at this time, which means that the base 122 has not been completely cured. A material of the base 122 is, for example, epoxy, PTFE, polyphenylene ether (PPE), polyimide (PI), BT (bismaleimide triazine) resin, phenolic novolac (PN) resin, and hydrocarbon. Then, the release film may be attached to the two opposite sides of the base 122, and the material of the release film is, for example, polyester polymer (PET). Next, the drilling process is performed on the base 122 to form the through hole and the opening. The drilling process is, for example, laser drilling or mechanical punching, but the disclosure is not limited thereto. After that, the conductive adhesive is stuffed in the through hole by printing or injection to form the conductive pillars 124. By printing or injection, a dielectric material with a low dielectric constant (Dk) and a low dissipation factor (Df) are printed in the opening and pre-baked to form the dielectric material bulk 126. Afterwards, the release film attached to the two opposite sides of the base 122 are removed, so that the two opposite surfaces of the conductive pillars 124 and two opposite surfaces of the dielectric material bulk 126 respectively protrude from the two opposite surfaces of the base 122, to complete the manufacture of the first substrate 120d. Here, a dissipation factor of the dielectric material bulk 126 is between 0.0002 and 0.006.

It is generally known that a high-frequency circuit emphasizes the speed and quality of a transmission signal, and a main factor affecting the two is an electrical characteristic of a transmission material, that is, the dielectric constant (Dk) and the dissipation factor (Df) of the material. By reducing the dielectric constant and the dissipation factor of the substrate, the signal propagation delay time may be effectively shortened, and the signal transmission rate may be increased and the signal transmission loss may be reduced. Since in this embodiment, only the relatively expensive dielectric material bulk 126 is disposed around the through hole T, compared with the previous entire substrate using such dielectric material, a usage quantity of the dielectric materials may be effectively reduced, which may effectively reduce the cost, and the signal transmission rate may be increased and the signal transmission loss may be reduced in this embodiment.

Figure 4A:
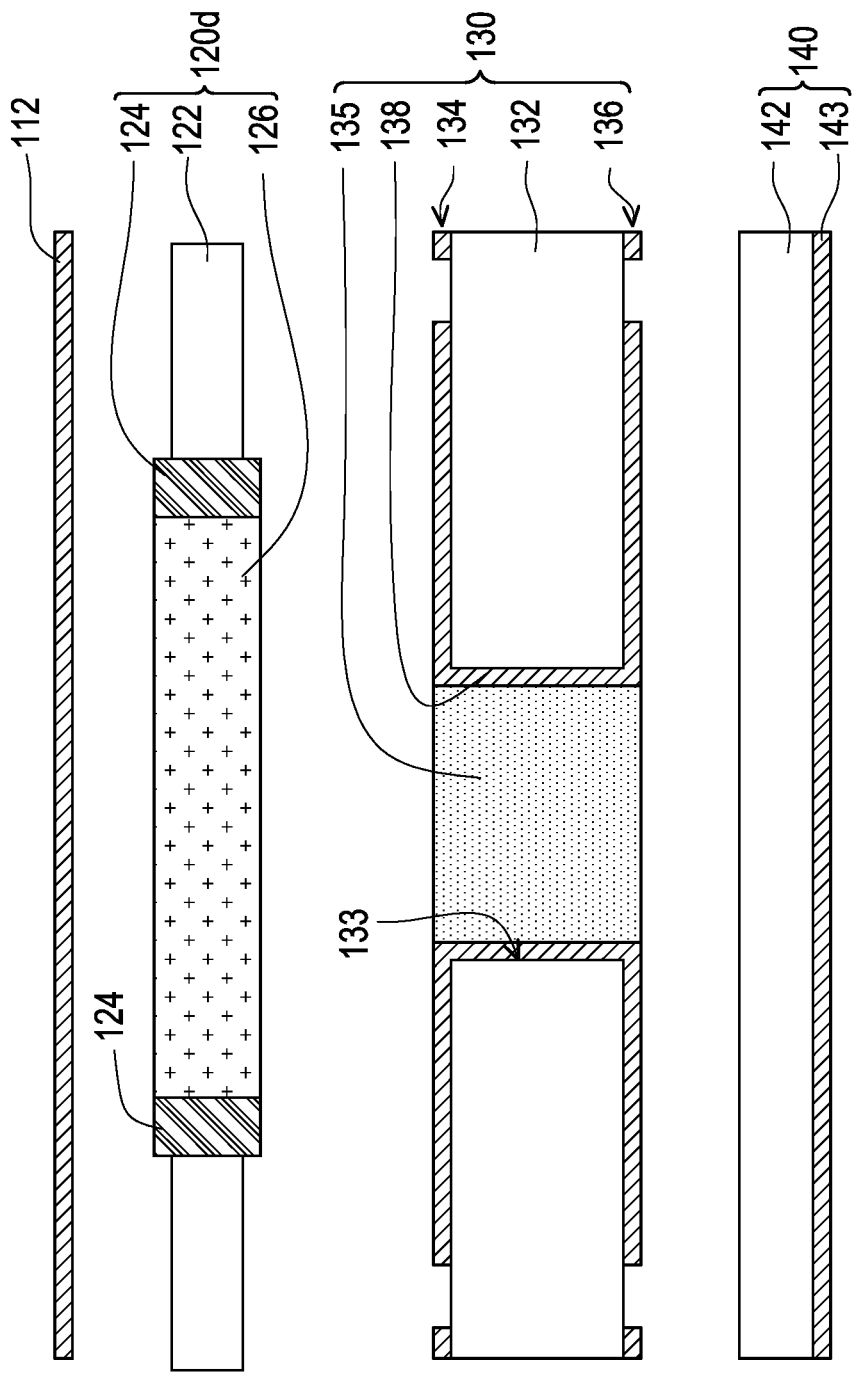
FIGS. 4A to 4E are schematic cross-sectional views of a manufacturing method of another circuit board according to another embodiment of the disclosure.
Figure 4B:
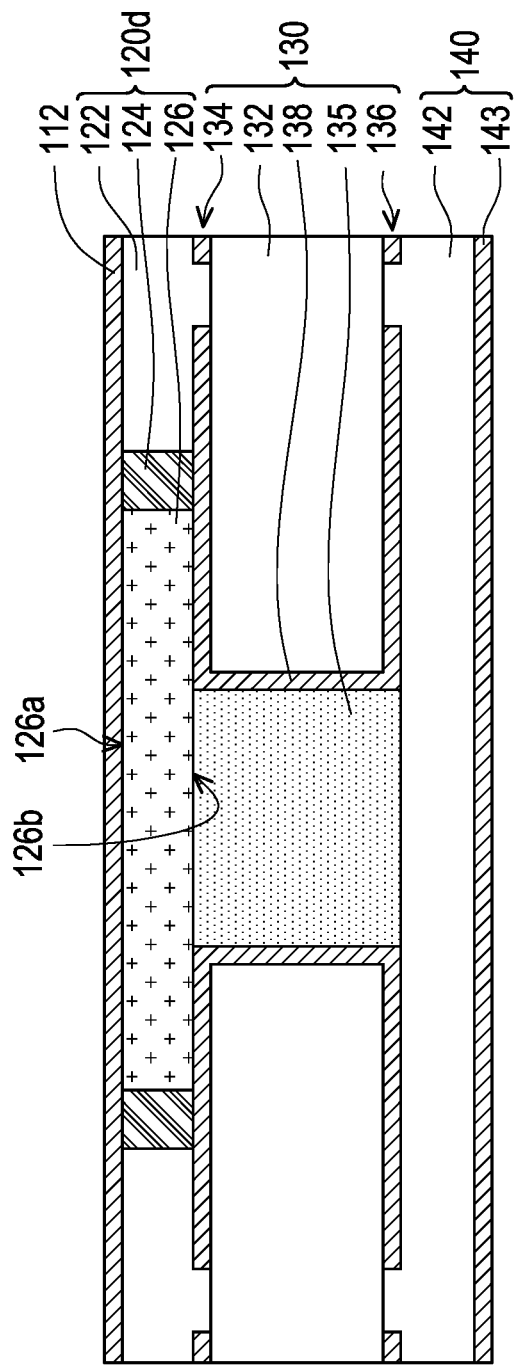

Referring to FIG. 4B, the thermal lamination process is performed to laminate the metal layer 112, the first substrate 120d, the second substrate 130, and the third substrate 140, so that the metal layer 112 directly covers the base 122 of the first substrate 120d, one side of the conductive pillars 124, and a surface 126a of the dielectric material bulk 126. The conductive pillars 124 connect the metal layer 112 and the first circuit layer 134 of the second substrate 130. An another surface 126b of the dielectric material bulk 126 directly contacts the first dielectric layer 135 and the first circuit layer 134 of the second substrate 130. The insulating layer 142 of the third substrate 140 is connected to the second circuit layer 136 of the second substrate 130, and covers the core layer 132, the first dielectric layer 135, and the second circuit layer 136.

Figure 4C:
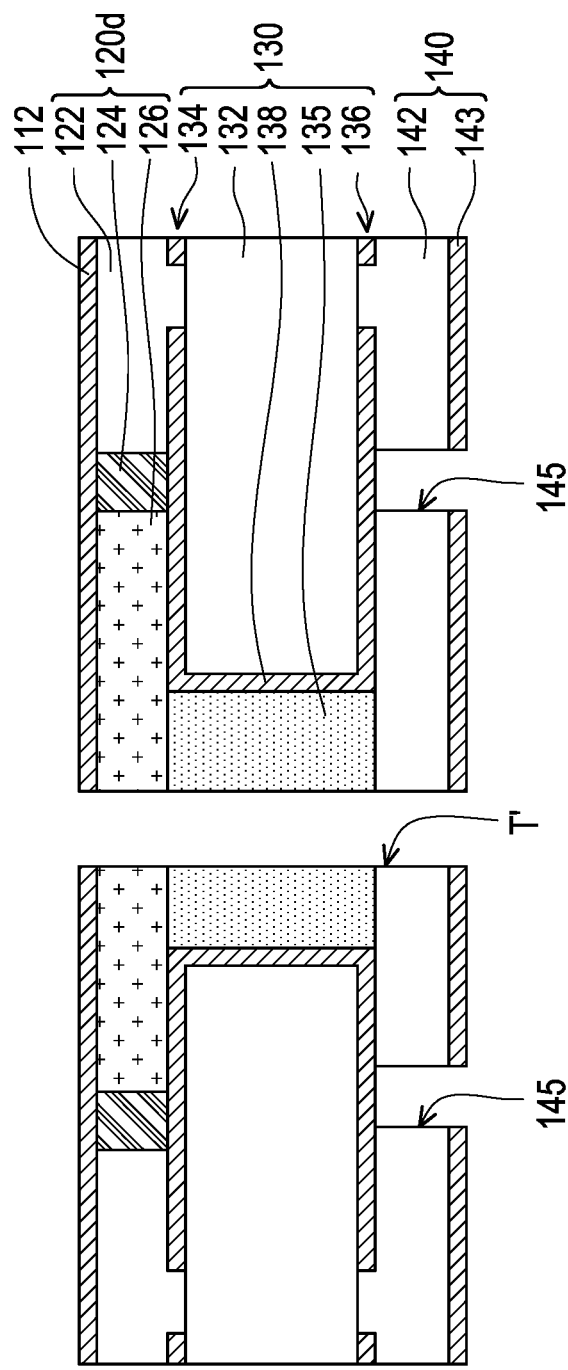

Referring to FIG. 4C, the blind holes 145 and a through hole T' are formed. The blind holes 145 extend from the third substrate 140 to the second substrate 130, and expose the second circuit layer 136. The through hole T' penetrates the metal layer 112, the dielectric material bulk 126 of the first substrate 120d, the first dielectric layer 135 of the second substrate 130, and the insulating layer 142 and the conductive layer 143 of the third substrate 140. Here, the method of forming the blind holes 145 is, for example, laser drilling, and a method of forming the through hole T' is, for example, mechanical drilling. However, the disclosure is not limited thereto.

Figure 4D:
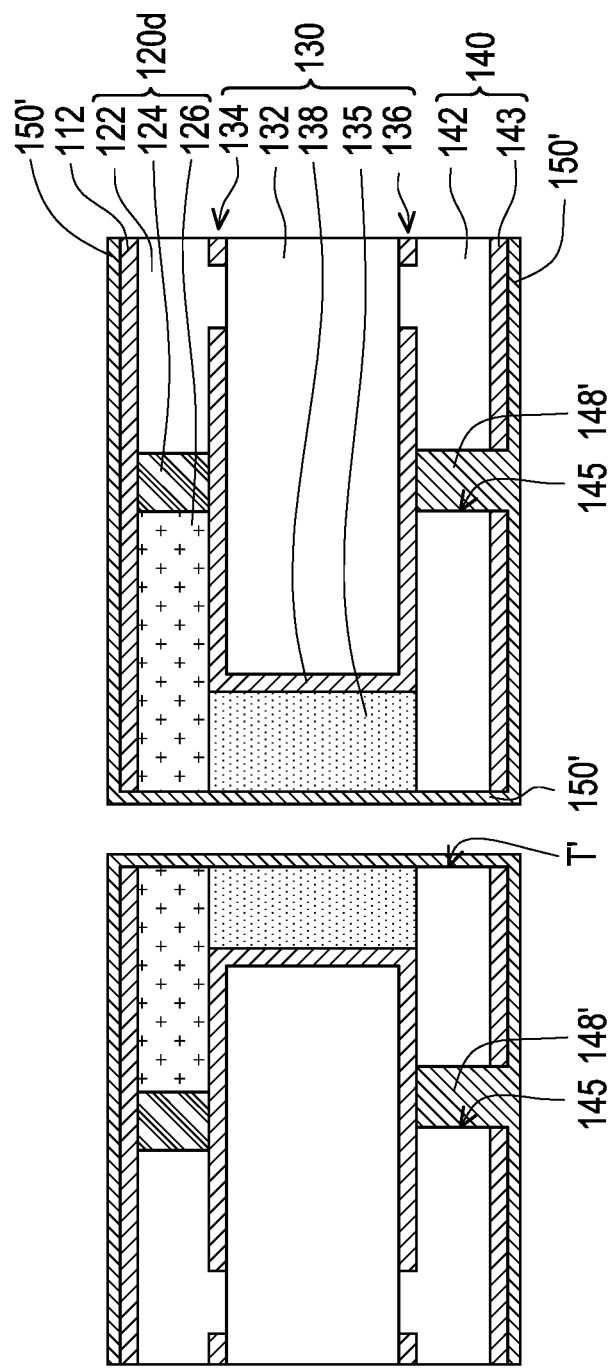

Referring to FIG. 4D, a conductive material layer 150' is formed, which covers the metal layer 112, the conductive layer 143 of the third substrate 140, and an inner wall of the through hole T', and fills the blind holes 145 to define multiple conductive holes 148'. Here, a method of forming the conductive material layer 150' is, for example, plating, and the conductive material layer 150' is, for example, copper. However, the disclosure is not limited thereto.

Figure 4E:
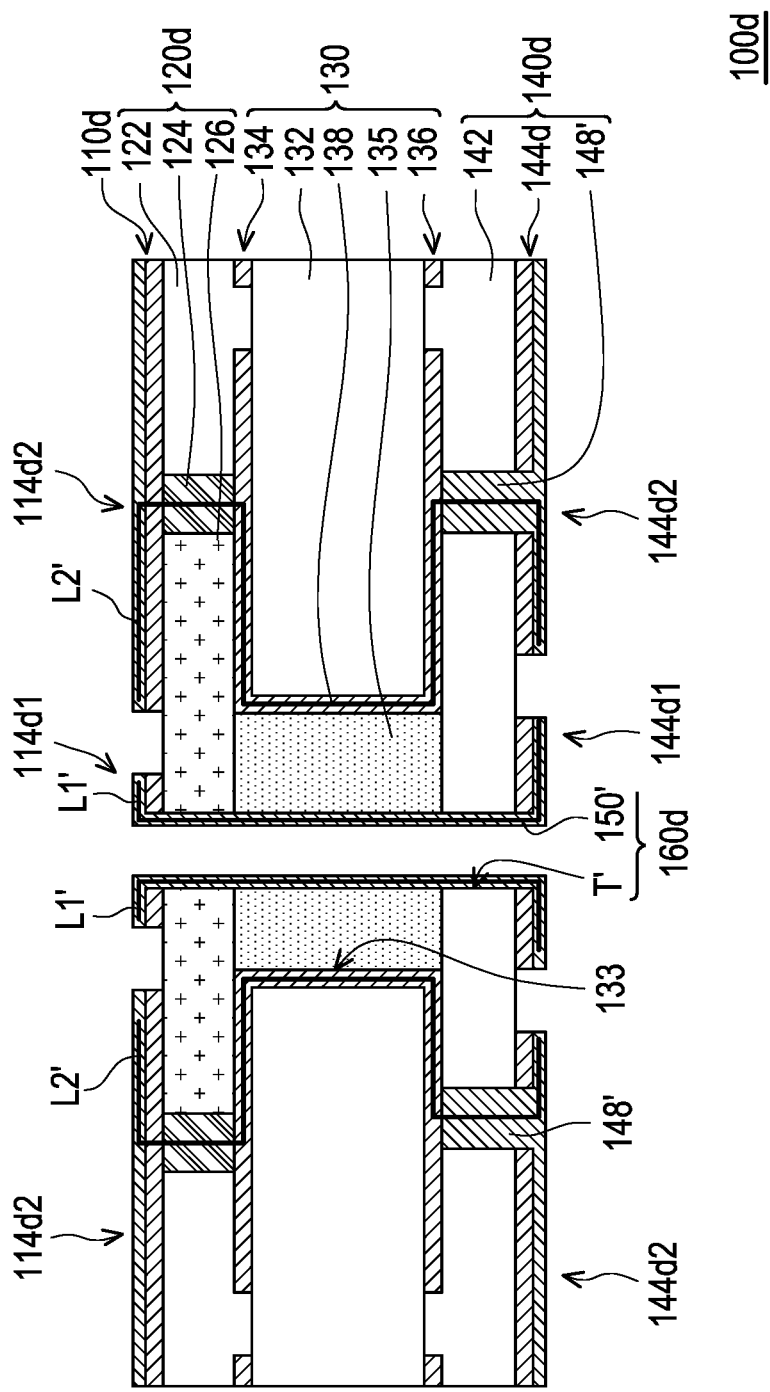

Finally, referring to both FIGS. 4D and 4E, the conductive material layer 150', the metal layer 112, and the conductive layer 143 are patterned through the lithography process to form a first external circuit layer 110d located on the first substrate 120d and electrically connected to the conductive pillars 124 and a second external circuit layer 144d located on the insulating layer 142 and electrically connected to the conductive holes 148', and define a conductive through hole structure 160d connecting the first external circuit layer 110d and the second external circuit layer 144d and located in the through hole T'. The conductive through hole structure 160d electrically connects the first external circuit layer 110d and the second external circuit layer 144d to define a signal path L1'. The first external circuit layer 110d, the conductive pillars 124, the second substrate 130, the conductive holes 148', and the second external circuit layer 144d are electrically connected to define a ground path L2'. In particular, the ground path L2' surrounds the signal path L1', and two sides of the signal path L1' and two sides of the ground path L2' are respectively located on the same plane. So far, the manufacture of a circuit board 100d has been completed.

In terms of the structure, referring to both FIGs. 1E and 4E, the circuit board 100d in this embodiment is similar to the circuit board 100a. A difference between the two is that in this embodiment, the first substrate 120d further includes the dielectric material bulk 126, which penetrates the base 122 and is located between the conductive pillars 124. The peripheral surface of the dielectric material bulk 126 directly contacts the conductive pillars 124. Through the configuration of the dielectric material bulk 126, not only the cost of the entire circuit board 100d may be reduced, but also the signal transmission rate may be increased and the signal transmission loss may be reduced.

Furthermore, the first external circuit layer 110d in this embodiment includes a first signal trace 114d1 and a first ground trace 114d2. The second external circuit layer 144d includes a second signal trace 144d1 and a second ground trace 144d2. The first signal trace 114d1, the conductive material layer 150', and the second signal trace 144d1 define the signal path L1'. The first ground trace 114d2, the conductive pillars 124, the first circuit layer 134, the conductive connection layer 138, the second circuit layer 136, the conductive holes 148', and the second ground trace 144d2 define the ground path L2'.

In brief, in this embodiment, the signal path L1' defined by the first signal trace 114d1, the conductive material layer 150', and the second signal trace 144d1 is surrounded by the ground path L2' defined by the first ground trace 114d2, the conductive pillars 124, the first circuit layer 134, the conductive connection layer 138, the second circuit layer 136, the conductive holes 148', and the second ground trace 144d2. This is, the ground path L2' with a good closure property is disposed around the signal path L 1' that may transmit the high-frequency and high-speed signal such as 5G. In this way, the good high-frequency and high-speed loop may be formed, so that the circuit board 100d in this embodiment may have better signal integrity.

Figure 5A:
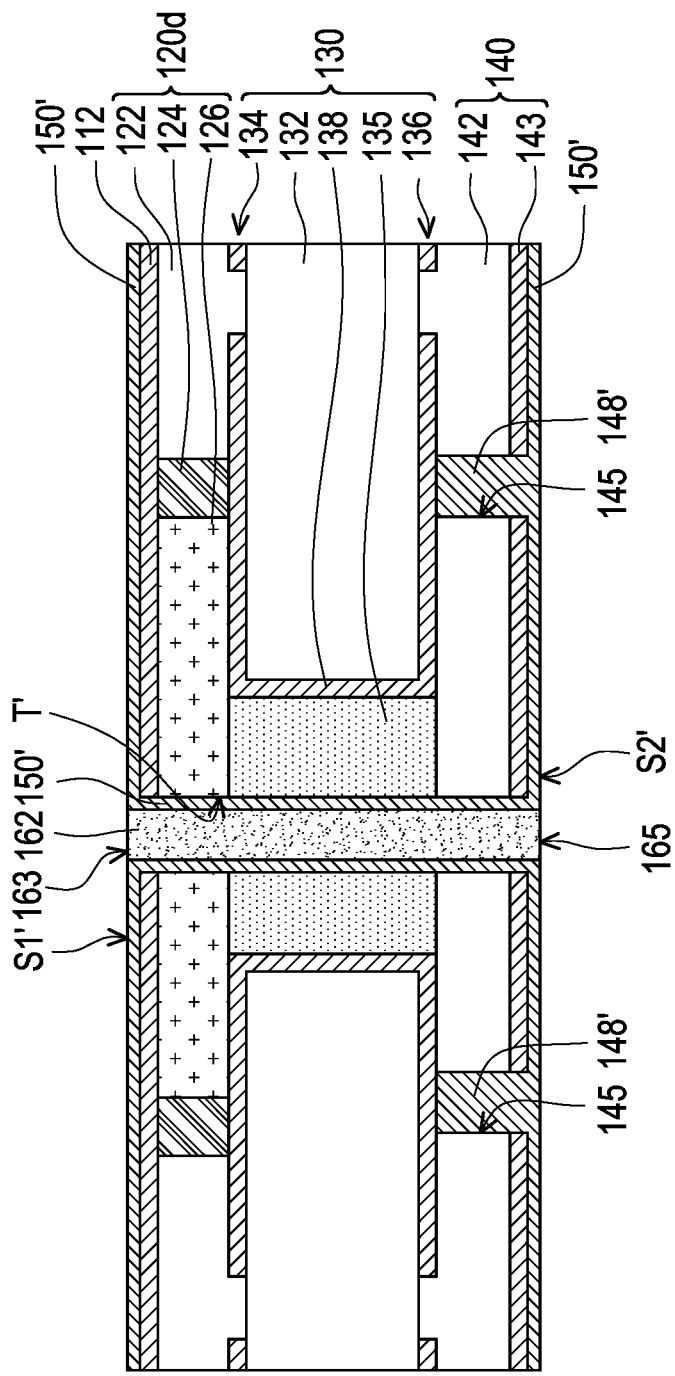
FIGS. 5A to 5B are schematic cross-sectional views of partial steps of a manufacturing method of another circuit board according to another embodiment of the disclosure.
Figure 5B:
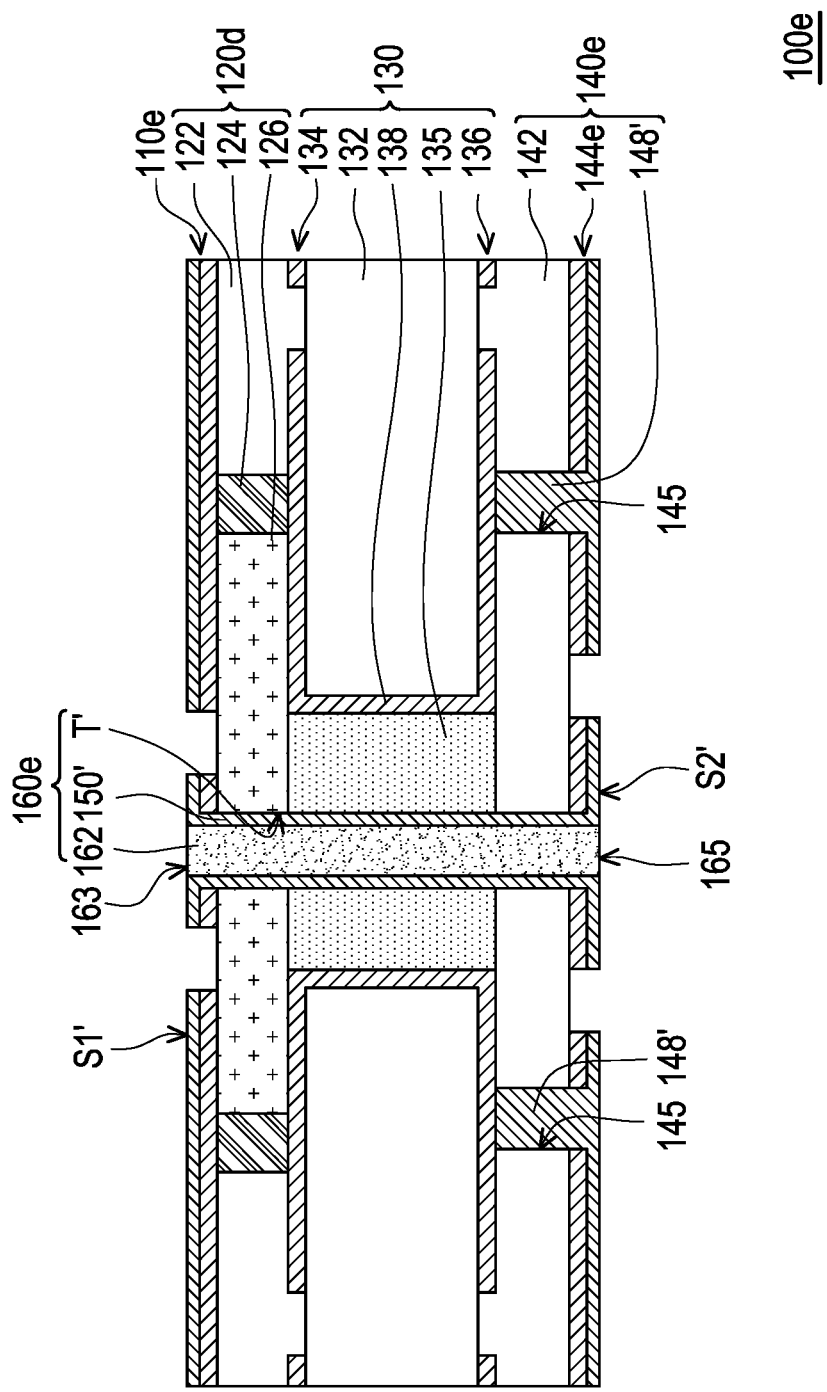

FIGS. 5A to 5B are schematic cross-sectional views of partial steps of a manufacturing method of another circuit board according to another embodiment of the disclosure. Referring to both FIGS. 4D and 5A, the manufacturing method of the circuit board in this embodiment is similar to that of the above circuit board. A difference between the two is that after forming the conductive material layer 150' in FIG. 4D, referring to FIG. 5A, the plugging process is performed to stuff the second dielectric layer 162 in the through hole T', and the second dielectric layer 162 fills the through hole T'. Preferably, the first surface 163 and the second surface 165 of the second dielectric layer 162 opposite to each other are respectively flush with an upper surface S1' and a lower surface S2' of the conductive material layer 150'. If the second dielectric layer 162 is higher than the upper surface S1' and the lower surface S2' of the conductive material layer 150', the first surface 163 and the second surface 165 of the second dielectric layer 162 are respectively flush with the conductive material layer 150' by selectively grinding. Here, the material of the second dielectric layer 162 is, for example, resin, which may be regarded as the plugging agent.

Referring to both FIGS. 5A and 5B, the lithography process is performed to pattern the conductive material layer 150', the metal layer 112, and the conductive layer 143, so as to form a first external circuit layer 110e and a second external circuit layer 144e. The first external circuit layer 110e is located on the base 122 of the first substrate 120d, and the second external circuit layer 144e is located on the insulating layer 142 of a third substrate 140e. Here, a conductive through hole structure 160e includes the through hole T', the conductive material layer 150', and the second dielectric layer 162 located in the through hole T'. So far, the manufacture of a circuit board 100e has been completed.

Figure 6A:
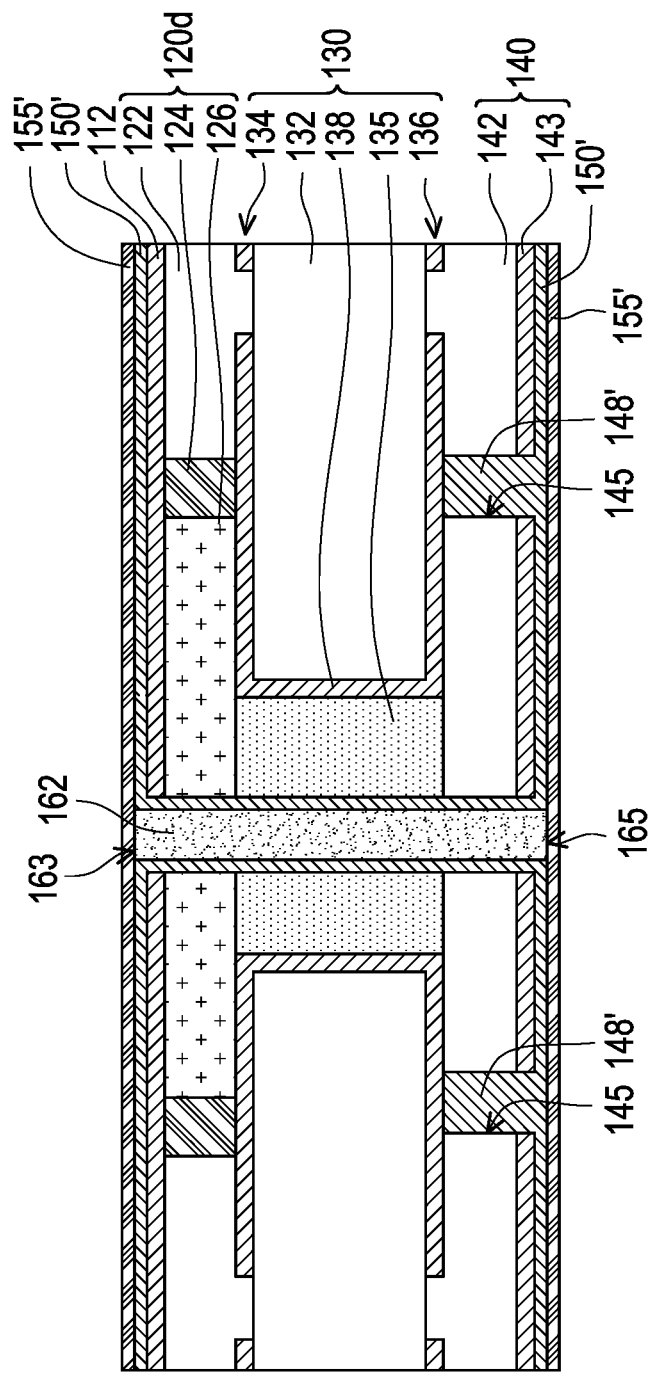
FIGS. 6A to 6B are schematic cross-sectional views of partial steps of a manufacturing method of another circuit board according to another embodiment of the disclosure.
Figure 6B:
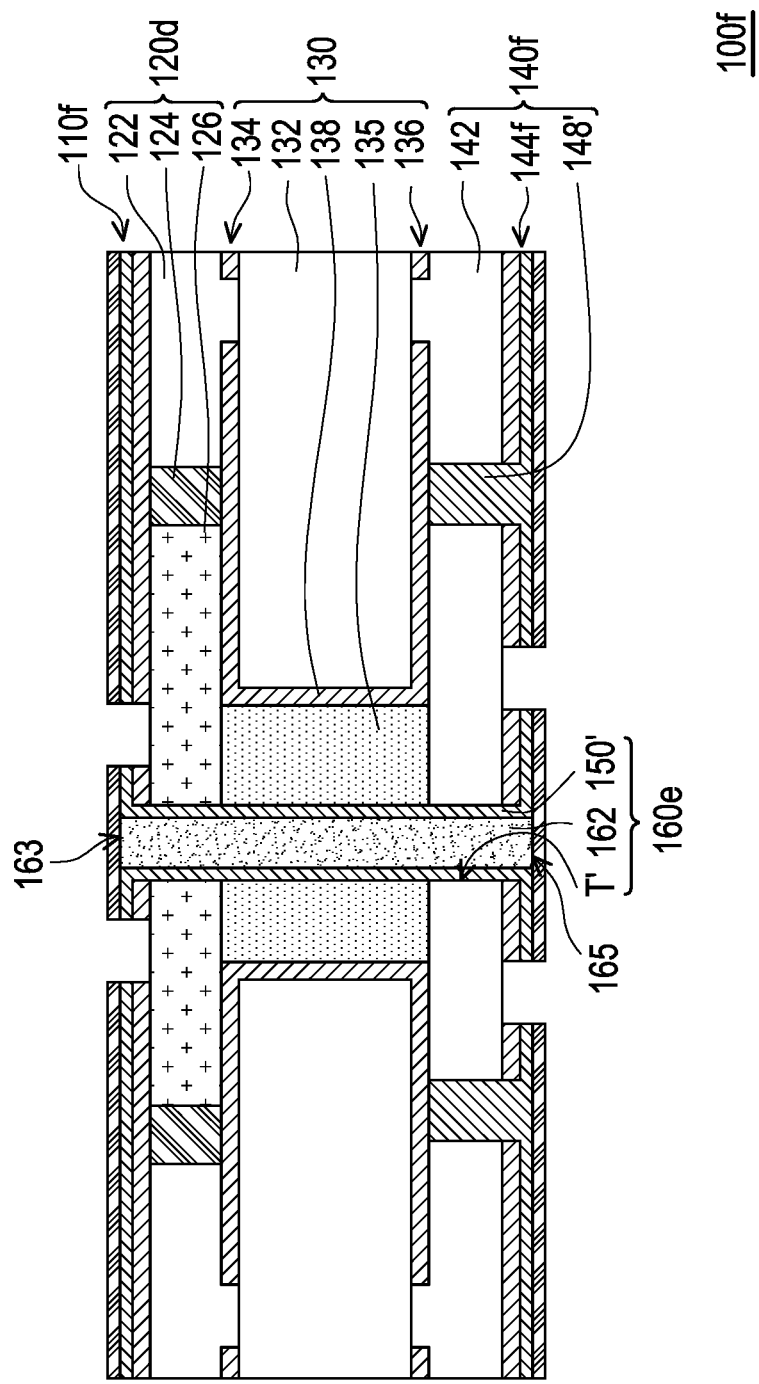

FIGS. 6A to 6B are schematic cross-sectional views of partial steps of a manufacturing method of another circuit board according to another embodiment of the disclosure. Referring to both FIGS. 5A and 6A, the manufacturing method of the circuit board in this embodiment is similar to that of the above circuit board. A difference between the two is that after stuffing the second dielectric layer 162 in the through hole T' in FIG. 5A, referring to FIG. 6A, a capping layer 155' is formed on the conductive material layer 150'. The capping layer 155' covers the conductive material layer 150', and the first surface 163 and the second surface 165 of the second dielectric layer 162. Here, a material of the capping layer 155' is, for example, copper, but the disclosure is not limited thereto.

Referring to both FIGS. 6A and 6B, the lithography process is performed to pattern capping layer 155', the conductive material layer 150', the metal layer 112, and the conductive layer 143, so as to form a first external circuit layer 110f and a second external circuit layer 144f. The first external circuit layer 110f is located on the base 122 of the first substrate 120d and on the first surface 163 of the second dielectric layer 162. The second external circuit layer 144f is located on the insulating layer 142 of the third substrate 140f and on the second surface 165 of the second dielectric layer 162. So far, the manufacture of a circuit board 100f has been completed.

Figure 7:
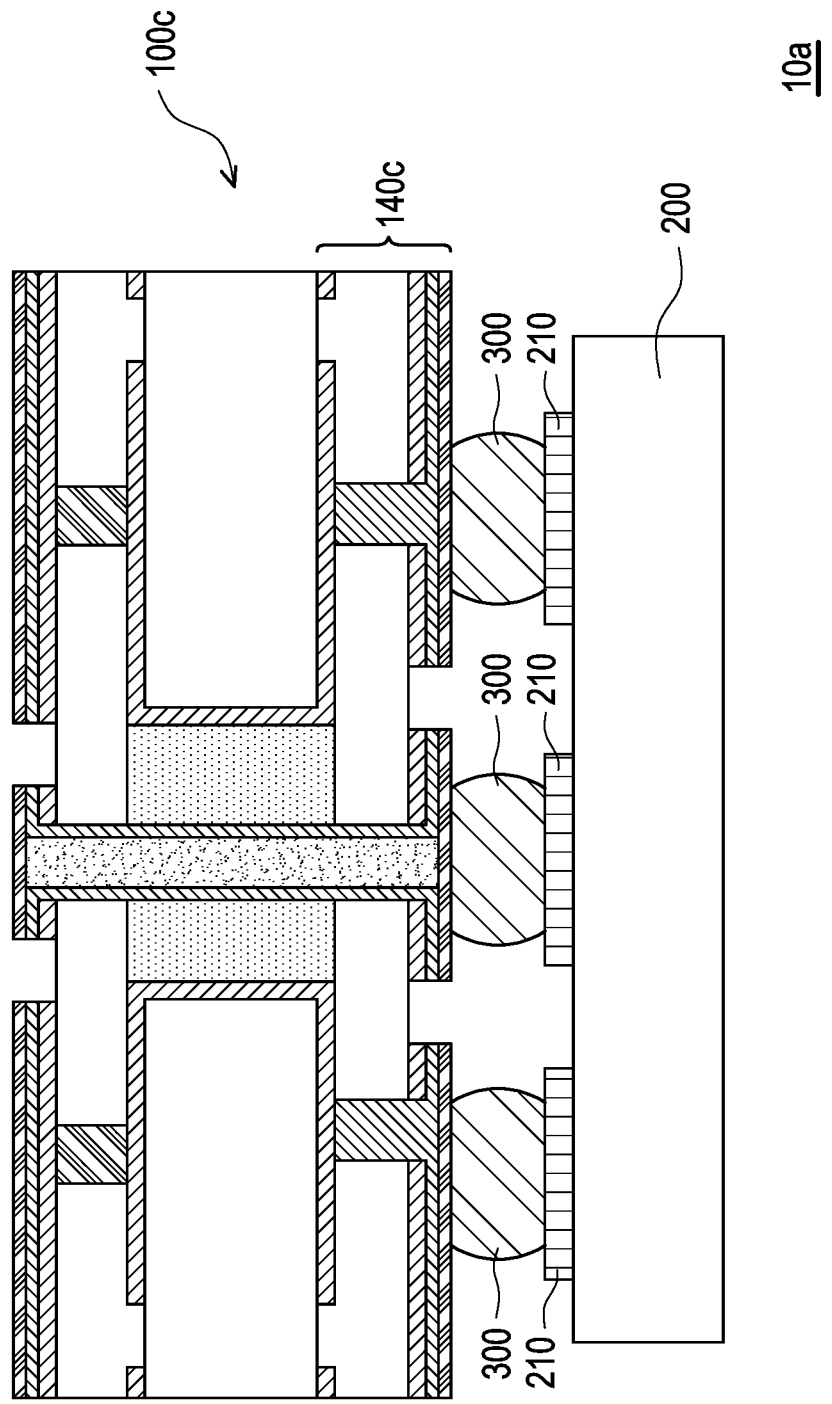
FIG. 7 is a schematic cross-sectional view of an electronic device according to an embodiment of the disclosure.

FIG. 7 is a schematic cross-sectional view of an electronic device according to an embodiment of the disclosure. Referring to FIG. 7, in this embodiment, an electronic device 10a includes, for example, the circuit board 100c as shown in FIG. 3B and an electronic element 200. The electronic element 200 is electrically connected to the circuit board 100c, and the electronic element 200 includes multiple pads 210. In addition, the electronic device 10a in this embodiment further includes multiple connecting members 300, which are disposed between the third substrate 140c of the circuit board 100c and the electronic element 200. The electronic element 200 is electrically connected to the circuit board 100c through the connecting members 300. Here, the connecting members 300 are, for example, multiple solder balls, but the disclosure is not limited thereto. In an application, an antenna structure may be disposed on the other side of the circuit board 100c relative to the electronic element 200, and the antenna structure may be electrically connected to the circuit board 100c. In an application of an integrated circuit and an antenna, the circuit board 100c in this embodiment may solve an issue of signal interference on the same plane, reduce the signal energy loss, and reduce the noise interference. As a result, the reliability of signal transmission may be improved.

Figure 8:
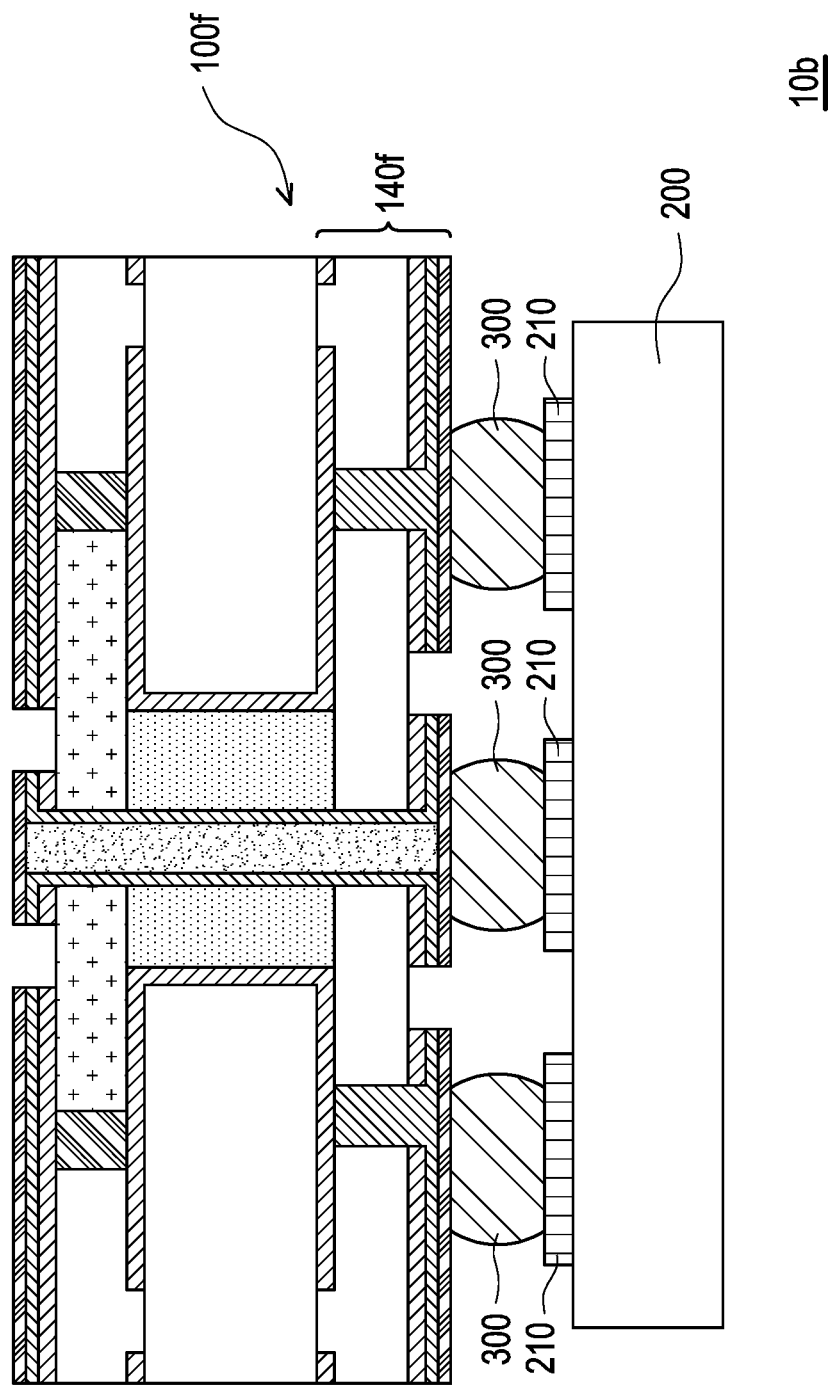
FIG. 8 is a schematic cross-sectional view of an electronic device according to another embodiment of the disclosure.

FIG. 8 is a schematic cross-sectional view of an electronic device according to another embodiment of the disclosure. Referring to FIG. 8, in this embodiment, an electronic device 10b includes, for example, the circuit board 100f as shown in FIG. 6B and the electronic element 200. The electronic element 200 is electrically connected to the circuit board 100f, and the electronic element 200 includes the pads 210. In addition, the electronic device 10b in this embodiment further includes the connecting members 300, which are disposed between the third substrate 140f of the circuit board 100f and the electronic element 200. The electronic element 200 is electrically connected to the circuit board 100f through the connecting members 300. Here, the connecting members 300 are, for example, the solder balls, but the disclosure is not limited thereto. In an application, the antenna structure may be disposed on the other side of the circuit board 100f relative to the electronic element 200, and the antenna structure may be electrically connected to the circuit board 100f. In an application of the integrated circuit and the antenna, the circuit board 100f in this embodiment may solve the issue of signal interference on the same plane, reduce the signal energy loss, and reduce the noise interference. As a result, the reliability of signal transmission may be improved.

Based on the above, in the design of the circuit board in the disclosure, the conductive aterial layer of the conductive through hole structure electrically connects the first external circuit layer and the second external circuit layer to define the signal path, and the first external circuit layer, the conductive pillars, the second substrate, the conductive holes, and the second external circuit layer are electrically connected to define the ground path. The ground path surrounds the signal path. In this way, the good high-frequency and high-speed signal loop may be formed, and in the subsequent applications of the integrated circuit and the antenna, the issue of signal interference on the same plane may also be solved, which may reduce the signal energy loss and reduce the noise interference. As a result, the reliability of signal transmission may be improved.

Although the disclosure has been described with reference to the above embodiments, it will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A circuit board, comprising a first external circuit layer, a first substrate, a second substrate, a third substrate, and a conductive through hole structure, wherein
the first substrate is disposed between the first external circuit layer and the second substrate, the first substrate comprises a plurality of conductive pillars, and the plurality of conductive pillars electrically connect the first external circuit layer and the second substrate;
the second substrate has an opening and comprises a first dielectric layer, the opening penetrates the second substrate, the first dielectric layer fills the opening, and the second substrate is disposed between the first substrate and the third substrate;
the third substrate comprises an insulating layer, a second external circuit layer located on the insulating layer, and a plurality of conductive holes penetrating the insulating layer and electrically connecting the second substrate and the second external circuit layer;
the conductive through hole structure comprises a through hole and a conductive material layer, the through hole penetrates the first substrate, the first dielectric layer of the second substrate, and the third substrate, and the conductive material layer covers an inner wall of the through hole and electrically connects the first external circuit layer and the second external circuit layer to define a signal path; and
the first external circuit layer, the plurality of conductive pillars, the second substrate, the plurality of conductive holes, and the second external circuit layer are electrically connected to define a ground path, wherein the ground path surrounds the signal path.

2. The circuit board according to claim 1, wherein the first substrate further comprises a base, the plurality of conductive pillars penetrates the base, the second substrate further comprises a core layer, a first circuit layer, a second circuit layer, and a conductive connection layer, the first circuit layer and the second circuit layer are respectively disposed on two opposite sides of the core layer, the core layer has the opening, the conductive connection layer is disposed on an inner wall of the opening and located between the first dielectric layer and the core layer, the conductive connection layer electrically connects the first circuit layer and the second circuit layer, and the plurality of conductive pillars electrically connect the first external circuit layer and the first circuit layer.

3. The circuit board according to claim 2, wherein the first substrate further comprises a dielectric material bulk penetrating the base and located between the plurality of conductive pillars, and a peripheral surface of the dielectric material bulk directly contacts the plurality of conductive pillars.

4. The circuit board according to claim 2, wherein the first external circuit layer comprises a first signal trace and a first ground trace, the second external circuit layer comprises a second signal trace and a second ground trace, and the first signal trace, the conductive material layer, and the second signal trace define the signal path, and the first ground trace, the plurality of conductive pillars, the first circuit layer, the conductive connection layer, the second circuit layer, the plurality of conductive holes, and the second ground trace define the ground path.

5. The circuit board according to claim 1, wherein the conductive through hole structure further comprises a second dielectric layer filling the through hole, and a first surface and a second surface of the second dielectric layer opposite to each other are respectively flush with an upper surface of the first external circuit layer and a lower surface of the second external circuit layer.

6. The circuit board according to claim 1, wherein the conductive through hole structure further comprises a second dielectric layer filling the through hole, and the first external circuit layer and the second external circuit layer respectively cover a first surface and a second surface of the second dielectric layer opposite to each other.

7. An electronic device, comprising:
a circuit board comprising a first external circuit layer, a first substrate, a second substrate, a third substrate, and a conductive through hole structure, wherein
the first substrate is disposed between the first external circuit layer and the second substrate, the first substrate comprises a plurality of conductive pillars, and the plurality of conductive pillars electrically connect the first external circuit layer and the second substrate;
the second substrate has an opening and comprises a first dielectric layer, the opening penetrates the second substrate, the first dielectric layer fills the opening, and the second substrate is disposed between the first substrate and the third substrate;
the third substrate comprises an insulating layer, a second external circuit layer located on the insulating layer, and a plurality of conductive holes penetrating the insulating layer and electrically connecting the second substrate and the second external circuit layer;
the conductive through hole structure comprises a through hole and a conductive material layer, the through hole penetrates the first substrate, the first dielectric layer of the second substrate, and the third substrate, and the conductive material layer covers an inner wall of the through hole and electrically connects the first external circuit layer and the second external circuit layer to define a signal path; and
the first external circuit layer, the plurality of conductive pillars, the second substrate, the plurality of conductive holes, and the second external circuit layer are electrically connected to define a ground path, wherein the ground path surrounds the signal path; and
an electronic element electrically connected to the circuit board.

8. The electronic device according to claim 7, further comprising:
a plurality of connecting members disposed between the third substrate of the circuit board and the electronic element, wherein the electronic element is electrically connected to the circuit board through the plurality of connecting members.

9. The electronic device according to claim 8, wherein the plurality of connecting members comprise a plurality of solder balls.

* * * * *